United States Patent
Takase et al.

(10) Patent No.: US 11,449,180 B2
(45) Date of Patent: Sep. 20, 2022

(54) METHOD FOR MANUFACTURING SUBSTRATE EQUIPPED WITH WIRING ELECTRODE, AND SUBSTRATE EQUIPPED WITH WIRING ELECTRODE

(71) Applicant: TORAY INDUSTRIES, INC., Tokyo (JP)

(72) Inventors: Kohei Takase, Otsu (JP); Tsukuru Mizuguchi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 482 days.

(21) Appl. No.: 16/481,234

(22) PCT Filed: Feb. 16, 2018

(86) PCT No.: PCT/JP2018/005487
§ 371 (c)(1),
(2) Date: Jul. 26, 2019

(87) PCT Pub. No.: WO2018/168325
PCT Pub. Date: Sep. 20, 2018

(65) Prior Publication Data
US 2019/0377235 A1    Dec. 12, 2019

(30) Foreign Application Priority Data

Mar. 17, 2017 (JP) .............................. JP2017-052311
Mar. 17, 2017 (JP) .............................. JP2017-052312
(Continued)

(51) Int. Cl.
*G06F 3/044*      (2006.01)
*G02F 1/1362*     (2006.01)
(Continued)

(52) U.S. Cl.
CPC ...... *G06F 3/0443* (2019.05); *G02F 1/136209* (2013.01); *G02F 1/136286* (2013.01);
(Continued)

(58) Field of Classification Search
CPC ...... G06F 3/0443; G06F 3/0445; G06F 3/045; G06F 3/046; G02F 1/136209;
(Continued)

(56) References Cited

U.S. PATENT DOCUMENTS 9,864,474 B2 *   1/2018   Hayashi ................ G06F 3/0412
10,203,822 B2 *   2/2019   Wang ................ G02F 1/133512
(Continued)

FOREIGN PATENT DOCUMENTS

JP          8-62617 A      3/1996
JP      2003-282985 A    10/2003
(Continued)

OTHER PUBLICATIONS

International Search Report, issued in PCT/JP2018/005487, PCT/ISA/210, dated May 15, 2018.
(Continued)

*Primary Examiner* — Ricardo Osorio
(74) *Attorney, Agent, or Firm* — Birch, Stewart, Kolasch & Birch, LLP

(57) ABSTRACT

The present invention provides a method for manufacturing a substrate equipped with a wiring electrode which has a fine pattern and is excellent in conductivity and in which an opaque wiring electrode is hardly visible. Disclosed is a method for manufacturing a substrate equipped with a wiring electrode including the steps of forming an opaque wiring electrode on at least one side of a transparent substrate, applying a positive photosensitive composition on one side of the transparent substrate, and exposing and developing the positive photosensitive composition using
(Continued)

the opaque wiring electrode as a mask to form a functional layer at a portion corresponding to the opaque wiring electrode.

18 Claims, 5 Drawing Sheets

(30) Foreign Application Priority Data

Sep. 26, 2017 (JP) .............................. JP2017-184504
Sep. 26, 2017 (JP) .............................. JP2017-184505

(51) Int. Cl.
    *G06F 3/045*     (2006.01)
    *G06F 3/046*     (2006.01)
    *G03F 7/023*     (2006.01)
    *G03F 7/20*     (2006.01)

(52) U.S. Cl.
    CPC ............ *G03F 7/023* (2013.01); *G03F 7/2002* (2013.01); *G03F 7/2022* (2013.01); *G06F 3/045* (2013.01); *G06F 3/046* (2013.01); *G06F 3/0445* (2019.05)

(58) Field of Classification Search
    CPC .. G02F 1/136286; G03F 7/023; G03F 7/2002; G03F 7/2022
    See application file for complete search history.

(56) References Cited

U.S. PATENT DOCUMENTS

| | | | |
|---|---|---|---|
| 10,345,941 B2 * | 7/2019 | Nakai | G02B 5/3083 |
| 10,359,895 B2 * | 7/2019 | Sunada | G02F 1/13338 |
| 10,459,582 B2 * | 10/2019 | Kim | G06F 3/0412 |
| 11,061,266 B2 * | 7/2021 | Wang | G06F 3/04164 |
| 2008/0186422 A1 * | 8/2008 | Ishii | G02F 1/136209 349/44 |
| 2009/0295285 A1 | 12/2009 | Tokunaga | |
| 2013/0147730 A1 * | 6/2013 | Chien | G06F 3/0412 345/173 |
| 2013/0215067 A1 * | 8/2013 | Hwang | G02B 27/0018 345/173 |
| 2014/0184934 A1 | 7/2014 | Park et al. | |
| 2015/0177876 A1 | 6/2015 | Ishii et al. | |
| 2015/0338700 A1 * | 11/2015 | Kimura | G06F 3/0446 349/12 |
| 2016/0216790 A1 * | 7/2016 | Ebihara | G06F 3/0446 |
| 2016/0370916 A1 * | 12/2016 | Hashimoto | G06F 3/0446 |
| 2017/0078513 A1 * | 3/2017 | Chang | G06F 3/0304 |
| 2017/0115786 A1 | 4/2017 | Kimura et al. | |
| 2017/0371453 A1 | 12/2017 | Nakayama et al. | |

FOREIGN PATENT DOCUMENTS

| | | | |
|---|---|---|---|
| JP | 2004-319895 A | | 11/2004 |
| JP | 2008185692 | * | 8/2008 |
| JP | 2009-4348 A | | 1/2009 |
| JP | 2013-218010 A | | 10/2013 |
| JP | 2014-16944 A | | 1/2014 |
| JP | 2014-130565 A | | 7/2014 |
| JP | 2015-184789 A | | 10/2015 |
| WO | WO 2014/069436 A1 | | 5/2014 |
| WO | WO 2016/006081 A1 | | 1/2016 |
| WO | WO 2016/151900 A1 | | 9/2016 |

OTHER PUBLICATIONS

Written Opinion of the International Searching Authority, issued in PCT/JP2018/005487, PCT/ISA/237, dated May 15, 2018.

* cited by examiner

Exposure

Exposure

Exposure

METHOD FOR MANUFACTURING SUBSTRATE EQUIPPED WITH WIRING ELECTRODE, AND SUBSTRATE EQUIPPED WITH WIRING ELECTRODE

TECHNICAL FIELD

The present invention relates to a method for manufacturing a substrate equipped with a wiring electrode having a transparent substrate, an opaque wiring electrode and a functional layer, and a substrate equipped with a wiring electrode. The present invention also relates to a method for manufacturing a substrate equipped with a wiring electrode having a transparent substrate, a wiring electrode and a light shielding layer, and a substrate equipped with a wiring electrode.

BACKGROUND ART

In recent years, touch panels have been widely used as input means. The touch panel includes a display unit such as a liquid crystal panel, and a touch panel sensor that detects information input to a specific position. Touch panel systems are roughly classified into a resistive film system, a capacitance system, an optical system, an electromagnetic induction system, an ultrasonic system, and the like according to a detection method of an input position. Among them, a capacitance-type touch panel has been widely used for reasons of optical brightness, excellent design, simple structure, and excellent function. The capacitance-type touch panel sensor has a first electrode and a second electrode orthogonal to the first electrode via an insulating layer, applies a voltage to the electrode on a touch panel surface, and outputs as a signal a contact position obtained by detecting a change in capacitance when a conductor such as a finger is in contact with the sensor. As a touch panel sensor used in the capacitance system, for example, there have been known a structure in which an electrode and an external connection terminal are formed on a pair of opposing transparent substrates and a structure in which electrodes and external connection terminals are formed on both sides of a transparent substrate. As a wiring electrode used for a touch panel sensor, a transparent wiring electrode has been generally used from the viewpoint of making the wiring electrode difficult to see; however, in recent years, an opaque wiring electrode containing a metal material has been widespread due to high sensitivity and an increase in size of a screen.

A touch panel sensor having an opaque wiring electrode containing a metal material has a problem that the opaque wiring electrode is visually recognized due to metallic gloss of the opaque wiring electrode. As a method of making the opaque wiring electrode less visible, it is conceivable to suppress reflection by blackening treatment of metal. As a metal blackening treatment liquid, for example, a hydrochloric acid solution in which tellurium is dissolved is proposed (see, for example, Patent Document 1). As a touch panel sensor in which a wiring electrode is hardly visible, a touch panel sensor having a transparent substrate and a metal electrode having a metal wiring portion and a low reflective layer containing fine particles has been proposed (see, for example, Patent Document 2).

PRIOR ART DOCUMENTS

Patent Documents

Patent Document 1: Japanese Patent Laid-open Publication No. 2006-233327

Patent Document 2: Japanese Patent Laid-open Publication No. 2013-235315

SUMMARY OF THE INVENTION

Problems to be Solved by the Invention

However, when the metal darkening technology described in Patent Document 1 is applied to a touch panel sensor, there is a problem that conductivity of the opaque wiring electrode is reduced due to oxidation of metal. The low reflective layer described in Patent Document 2 is formed by an inkjet method, is difficult to be finely processed, and has a problem that the wiring electrode is visually recognized due to positional deviation between the metal wiring portion and the low reflective layer. The present invention has been made in view of the above-mentioned circumstances, and an object thereof is to provide a method for manufacturing a substrate equipped with a wiring electrode which has a fine pattern and is excellent in conductivity and in which an opaque wiring electrode and the wiring electrode are hardly visible.

Solutions to the Problems

The present invention mainly has the following constitutions, in order to solve the above-mentioned problems.

A method for manufacturing a substrate equipped with a wiring electrode, the method including the steps of: forming an opaque wiring electrode on at least one side of a transparent substrate; applying a positive photosensitive composition on one side of the transparent substrate; and exposing and developing the positive photosensitive composition using the opaque wiring electrode as a mask to form a functional layer at a portion corresponding to the opaque wiring electrode.

A method for manufacturing a substrate equipped with a wiring electrode, the method including the steps of: forming a pattern of a light shielding layer on one side of a transparent substrate; applying a positive photosensitive conductive composition to one side of the transparent substrate; and exposing and developing the positive photosensitive conductive composition using the light shielding layer as a mask to form a wiring electrode at a portion corresponding to the light shielding layer.

Effects of the Invention

According to the present invention, it is possible to obtain a substrate equipped with a wiring electrode which has a fine pattern and is excellent in conductivity and in which an opaque wiring electrode and the wiring electrode are hardly visible.

EMBODIMENTS OF THE INVENTION

Figure 1:
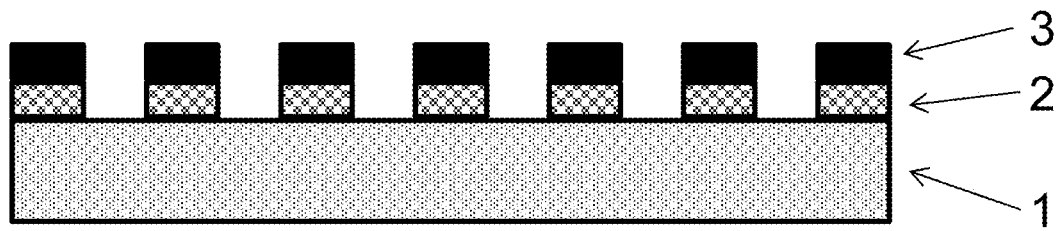
FIG. 1 is a schematic view showing an example of a configuration of a substrate equipped with a wiring electrode of the present invention.

A first method for manufacturing a substrate equipped with a wiring electrode of the present invention, includes the steps of forming an opaque wiring electrode on at least one side of a transparent substrate, applying a positive photosensitive composition on one side of the transparent substrate, and exposing and developing the positive photosensitive composition using the opaque wiring electrode as a mask to form a functional layer at a portion corresponding to the opaque wiring electrode. When the opaque wiring electrode is formed on the transparent substrate and the positive photosensitive composition is exposed using the opaque wiring electrode as a mask, the functional layer can be formed at the portion corresponding to the opaque wiring electrode, and a substrate equipped with a wiring electrode which is excellent in conductivity and in which the opaque wiring electrode is hardly visible can be obtained. When the positive photosensitive composition is applied to a side opposite to an opaque wiring electrode formation surface of the transparent substrate, the order of the step of forming the opaque wiring electrode and the step of applying the positive photosensitive composition is not limited. The manufacturing method may further include other steps as needed.

The transparent substrate preferably has transparency for irradiation energy of exposure light. Specifically, transmittance of light with a wavelength of 365 nm is preferably 50% or more, and more preferably 80% or more. The positive photosensitive composition can be efficiently exposed by setting the transmittance of the light with a wavelength of 365 nm to 50% or more. The transmittance of the transparent substrate at a wavelength of 365 nm can be measured using an ultraviolet-visible spectrophotometer (U-3310 manufactured by Hitachi High-Technologies Corporation).

Examples of the transparent substrate include a transparent substrate having no flexibility and a flexible transparent substrate. Examples of the transparent substrate having no flexibility include quartz glass, soda glass, chemical tempered glass, "Pyrex (registered trademark)" glass, synthetic quartz plates, epoxy resin substrates, polyetherimide resin substrates, polyether ketone resin substrates, and polysulfone resin substrates. Examples of the flexible transparent substrates include transparent films made of resins such as a polyethylene terephthalate film (hereinafter referred to as "PET film"), a cycloolefin polymer film, a polyimide film, a polyester film, and an aramid film and optical resin plates. These substrates may be stacked when used, and for example, a plurality of transparent substrates may be laminated with an adhesive layer when used. An insulating layer may be provided on the surface of these transparent substrates.

The thickness of the transparent substrate is appropriately selected according to materials in a range having the transparency described above as long as an opaque wiring electrode can be stably supported. For example, from the viewpoint of supporting the opaque wiring electrode more stably, in the case of a transparent substrate having no flexibility such as glass, the thickness is preferably 0.3 mm or more, and in the case of a transparent substrate having flexibility such as a PET film, the thickness is preferably 25 μm or more. On the other hand, from the viewpoint of further improving the transparency of exposure light, in the case of the transparent substrate having no flexibility such as glass, the thickness is preferably 1.5 mm or less, and in the case of the transparent substrate having flexibility such as a PET film, the thickness is preferably 300 μm or less.

The opaque wiring electrode preferably has a light shielding property for irradiation energy of exposure light. Specifically, the transmittance of light with a wavelength of 365 nm is preferably 20% or less, and more preferably 10% or less. When the transmittance of the light with a wavelength of 365 nm is set to 20% or less, a pattern of a positive photosensitive composition can be formed using the opaque wiring electrode as a mask, and a functional layer can be formed at a portion corresponding to the opaque wiring electrode. The transmittance can be measured by a microscopic area spectroscopic color difference meter (VSS 400: manufactured by Nippon Denshoku Industries Co., Ltd.) for an opaque wiring electrode of 0.1 mm square or larger on the transparent substrate.

Examples of materials constituting the opaque wiring electrode include metals such as silver, gold, copper, platinum, lead, tin, nickel, aluminum, tungsten, molybdenum, chromium, titanium, and indium and conductive particles of alloys thereof. Among these materials, silver, copper and gold are preferable from the viewpoint of conductivity.

The shape of conductive particles is preferably spherical.

From the viewpoint of improving dispersibility of the conductive particles, the average particle diameter of the conductive particles is preferably 0.05 μm or more, and more preferably 0.1 μm or more. On the other hand, from the viewpoint of sharpening an end of a pattern of the opaque wiring electrode, the average particle diameter is preferably 1.5 μm or less and more preferably 1.0 μm or less. The average particle diameter of the conductive particles can be obtained by enlarging and observing the conductive particles at a magnification of 15000 times using a scanning electron microscope (SEM) or a transmission electron microscope (TEM), measuring each major axis length of 100 randomly selected conductive particles, and calculating the number average value.

The aspect ratio of the conductive particles is preferably 1.0 or more from the viewpoint of improving a contact probability between the conductive particles and reducing a variation in resistance value of the opaque wiring electrode.

On the other hand, from the viewpoint of suppressing shielding of exposure light in an exposure step and widening a development margin, the aspect ratio of the conductive particles is preferably 2.0 or less and more preferably 1.5 or less. The aspect ratio of the conductive particles can be obtained by enlarging and observing the conductive particles at a magnification of 15000 times using SEM or TEM, measuring each major axis length and minor axis length of 100 randomly selected conductive particles, and calculating a ratio of average values of the major axis length and the minor axis length.

The opaque wiring electrode may contain an organic component together with the above-mentioned conductive particles. The opaque wiring electrode may be formed of, for example, conductive particles, an alkali-soluble resin, a cured product of a photosensitive conductive composition containing a photopolymerization initiator, and in this case, the opaque wiring electrode contains a photopolymerization initiator and/or contains photolysis products of the photopolymerization initiator. The photosensitive conductive composition may, if necessary, contain additives such as a thermosetting agent and a leveling agent.

Examples of the pattern shape of the opaque wiring electrode include a mesh shape and a stripe shape. Examples of the mesh shape include a lattice shape in which a unit shape is a triangle, a quadrangle, a polygon, a circle or the like and lattice shapes in which these unit shapes are combined. Among them, the mesh shape is preferable from the viewpoint of making conductivity of the pattern uniform. The opaque wiring electrode is more preferably a metal mesh formed of the above-mentioned metal and having a mesh-like pattern.

The thickness of the opaque wiring electrode is preferably 0.01 μm or more, more preferably 0.05 μm or more, and still more preferably 0.1 μm or more, from the viewpoint of further improving the light shielding property. On the other hand, the thickness of the opaque wiring electrode is preferably 10 μm or less, more preferably 5 μm or less, and still more preferably 3 μm or less, from the viewpoint of forming finer wiring.

The line width of the pattern of the opaque wiring electrode is preferably 1 μm or more, more preferably 1.5 μm or more, and still more preferably 2 μm or more from the viewpoint of further improving the conductivity. On the other hand, the line width of the pattern of the opaque wiring electrode is preferably 10 μm or less, preferably 7 μm or less, and more preferably 6 μm or less, from the viewpoint of making the wiring electrode less visible.

A positive photosensitive composition refers to a composition having positive photosensitivity where a light-irradiated part dissolves in a developer and exhibiting various functionalities such as light shielding property, conductivity, and insulation when a functional layer is formed. For example, the positive photosensitive composition preferably contains a photosensitizer (dissolution inhibitor) and an alkali-soluble resin. In the present invention, the functional layer preferably has a light shielding property, and the positive photosensitive composition is preferably a positive photosensitive light-shielding composition.

The positive photosensitive light-shielding composition refers to a composition having positive photosensitivity where a light-irradiated part dissolves in a developer and exhibiting a light shielding property when a light shielding layer is formed, and reflectance of the light shielding layer is preferably within a preferred range described later. For example, the positive photosensitive light-shielding composition preferably contains a colorant, a photosensitizer (dissolution inhibitor), and an alkali-soluble resin.

Examples of the colorant include dyes, organic pigments, and inorganic pigments. Two or more of those colorants may be contained.

Examples of the dyes include oil-soluble dyes, disperse dyes, reactive dyes, acid dyes, and direct dyes. Examples of the skeleton structure of the dye include anthraquinone type, azo type, phthalocyanine type, methine type, oxazine type, and metal-containing complex salt dyes thereof. Specific examples of the dye include "SUMIPLAST (registered trademark)" dye (trade name, manufactured by Sumitomo Chemical Co., Ltd.), Zapon and "Neozapon (registered trademark)" (trade names, manufactured by BASF Corporation), Kayaset and Kayakalan dyes (trade names, manufactured by Nippon Kayaku Co., Ltd.), Valifastcolors dye (trade name, manufactured by Orient Chemical Industries Co., Ltd.), and Savinyl (trade name, manufactured by Clariant Japan Co., Ltd.).

As the organic pigment, carbon black is preferable. Specific examples of the carbon black include furnace black, thermal black, channel black, and acetylene black.

Examples of the inorganic pigments include manganese oxide, titanium oxide, titanium oxinitride, chromium oxide, vanadium oxide, iron oxide, cobalt oxide, and niobium oxide.

The content of the colorant in the positive photosensitive light-shielding composition is preferably 1% by mass or more and more preferably 2% by mass or more based on the total solid content, from the viewpoint of further reducing the reflectance of the light shielding layer to make the opaque wiring electrode less visible. On the other hand, the content of the colorant is preferably 30% by mass or less and more preferably 20% by mass or less based on the total solid content, from the viewpoint of advancing the photoreaction of the positive photosensitive light-shielding composition more effectively and suppressing residue.

As the photosensitizer (dissolution inhibitor), one generating an acid by exposure energy is preferable. Examples thereof include diazodisulfone compounds, triphenylsulfonium compounds, and quinonediazide compounds. Examples of the diazodisulfone compound include bis(cyclohexylsulfonyl)diazomethane, bis(tertiarybutylsulfonyl)diazomethane, and bis(4-methylphenylsulfonyl)diazomethane. Examples of the triphenylsulfonium compound include diphenyl-4-methylphenylsulfonium trifluoromethanesulfonate, diphenyl-2,4,6-trimethylphenylsulfonium p-toluenesulfonate, and diphenyl(4-methoxyphenyl)sulfonium trifluoromethanesulfonate. Examples of the quinonediazide compound include a compound in which the sulfonic acid of quinone diazide has been bonded to a polyhydroxy compound via an ester, a compound in which the sulfonic acid of quinone diazide has been sulfonamide-bonded to a polyamino compound, and a compound in which the sulfonic acid of quinone diazide has been ester-bonded and/or sulfonamide-bonded to a polyhydroxypolyamino compound. Two or more of those colorants may be contained.

The content of the photosensitizer (dissolution inhibitor) in the positive photosensitive composition is preferably 5 parts by mass or more and more preferably 15 parts by mass or more based on 100 parts by mass of the alkali-soluble resin from the viewpoint of suppressing dissolution of the alkali-soluble resin in an unexposed portion. On the other hand, the content of the photosensitizer (dissolution inhibitor) is preferably 40 parts by mass or less and more preferably 30 parts by mass or less based on 100 parts by mass of the alkali-soluble resin from the viewpoint of suppressing excessive light absorption due to the photosensitizer (dissolution inhibitor) in an exposed portion and suppressing generation of residue.

Examples of the alkali-soluble resin include resins having a hydroxyl group and/or a carboxyl group.

Examples of the resin having a hydroxy group include a phenol novolak resin having a phenolic hydroxy group, a novolak resin such as a cresol novolac resin, a polymer of a monomer having a hydroxy group, and a copolymer of a monomer having a hydroxy group and styrene, acrylonitrile, an acrylic monomer and the like.

Examples of the monomer having a hydroxy group include monomers having a phenolic hydroxy group such as 4-hydroxystyrene and hydroxyphenyl (meth)acrylate; and monomers having a non-phenolic hydroxyl group such as 2-hydroxyethyl (meth)acrylate, 2-hydroxypropyl (meth)acrylate, 3-methyl-3-hydroxybutyl (meth)acrylate, 1,1-dimethyl-3-hydroxybutyl (meth)acrylate, 1,3-dimethyl-3-hydroxybutyl (meth)acrylate, 2,2,4-trimethyl-3-hydroxypentyl (meth)acrylate, 2-ethyl-3-hydroxyhexyl (meth)acrylate, glycerol mono(meth)acrylate, polypropylene glycol mono (meth)acrylate and polyethylene glycol mono(meth)acrylate.

Examples of the resin having a carboxyl group include a carboxylic acid modified epoxy resin, a carboxylic acid modified phenol resin, a polyamic acid, a carboxylic acid modified siloxane resin, a polymer of a monomer having a carboxyl group, and a copolymer of a monomer having a carboxyl group and styrene, acrylonitrile, an acrylic monomer and the like.

Examples of the monomer having a carboxyl group include acrylic acid, methacrylic acid, maleic acid, fumaric acid, crotonic acid, itaconic acid, citraconic acid, and cinnamic acid.

Examples of the resin having a hydroxy group and a carboxy group include a copolymer of a monomer having a hydroxy group and a monomer having a carboxyl group and a copolymer of a monomer having a hydroxy group, a monomer having a carboxyl group and styrene, acrylonitrile, an acrylic monomer and the like. Two or more of those colorants may be contained.

Among them, resins containing a phenolic hydroxy group and a carboxyl group are preferable. By containing a phenolic hydroxy group, when a quinonediazide compound is used as a photosensitizer (dissolution inhibitor), the phenolic hydroxy group and the quinonediazide compound form a hydrogen bond, and solubility in a developer of an unexposed portion of a positive photosensitive compound layer can be reduced. Further, a solubility difference between the unexposed portion and an exposed portion becomes large, and a development margin can be widened. Furthermore, by containing a carboxyl group, the solubility in a developer improves, and development time can be easily adjusted by the content of the carboxyl group.

The acid value of an alkali-soluble resin having a carboxyl group is preferably 50 mg KOH/g or more from the viewpoint of solubility in a developer, and is preferably 250 mg KOH/g or less from the viewpoint of suppressing excessive dissolution of an unexposed portion. The acid value of the alkali-soluble resin having a carboxyl group can be measured in accordance with JIS K 0070 (1992).

The positive photosensitive composition may contain a thermosetting compound. Since hardness of the light shielding layer is improved by containing the thermosetting compound, chipping and peeling due to contact with other members can be suppressed, and adhesion to the opaque wiring electrode can be improved. Examples of the thermosetting compound include monomers, oligomers and polymers having an epoxy group.

The positive photosensitive composition preferably contains a solvent, and the viscosity of the composition can be adjusted to a desired range. Examples of the solvent include N,N-dimethylacetamide, N,N-dimethylformamide, N-methyl-2-pyrrolidone, 2-pyrrolidone, dimethyl imidazolidinone, dimethyl sulfoxide, diethylene glycol monoethyl ether, diethylene glycol monoethyl ether acetate, diethylene glycol monomethyl ether acetate, γ-butyrolactone, ethyl lactate, 1-methoxy-2-propanol, ethylene glycol mono-n-propyl ether, diacetone alcohol, tetrahydrofurfuryl alcohol, and propylene glycol monomethyl ether acetate. Two or more of those colorants may be contained.

The positive photosensitive composition may contain a plasticizer, a leveling agent, a surfactant, a silane coupling agent, an antifoaming agent, a stabilizer and the like as long as desired properties of the positive photosensitive composition are not impaired. Examples of the plasticizer include dibutyl phthalate, dioctyl phthalate, polyethylene glycol, and glycerin. Examples of the leveling agent include special vinyl-based polymers and special acryl-based polymers. Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane, and vinyltrimethoxysilane.

Examples of the functional layer include a light shielding layer that shields the opaque wiring electrode, a conductive auxiliary layer that improves the conductivity of the opaque wiring electrode, a protective layer that protects the opaque wiring electrode, and an insulating layer that insulates the opaque wiring electrode. In the present invention, the functional layer is preferably a light shielding layer. The light shielding layer is preferably formed of a cured product of the above-mentioned positive photosensitive light-shielding composition, and in this case, the light shielding layer preferably contains a photosensitizer and/or photolysis products of the photosensitizer.

The light shielding layer is preferably formed at a portion corresponding to the opaque wiring electrode to reduce the reflectance of the opaque wiring electrode. Specifically, reflectance of light having a wavelength of 550 nm of the light shielding layer is preferably 25% or less and more preferably 10% or less. By setting the reflectance of the light shielding layer to 25% or less, reflection of the opaque wiring electrode can be suppressed, and the wiring electrode can be made less visible. The reflectance of the light shielding layer can be measured by a reflectometer (VSR-400: manufactured by Nippon Denshoku Industries Co., Ltd.) for a light shielding layer of 0.1 mm square or larger on the transparent substrate.

As a method of setting the reflectance of light having a wavelength of 550 nm of the light shielding layer to the above range, for example, there are a method using a positive photosensitive light-shielding composition having a preferable composition described above and a method of setting the thickness of the light shielding layer to a preferred range described later.

The thickness of the light shielding layer is preferably 0.1 μm or more, more preferably 0.5 μm or more, and still more preferably 1 μm or more, from the viewpoint of further reducing the reflectance of the opaque wiring electrode. On the other hand, from the viewpoint of suppressing residue and forming a finer pattern, the thickness of the light shielding layer is preferably 20 µm or less, more preferably 10 µm or less, and still more preferably 5 µm or less.

Figure 2:
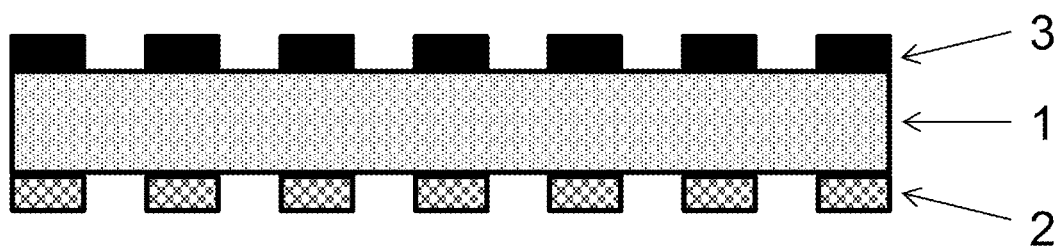
FIG. 2 is a schematic view showing another example of the configuration of the substrate equipped with a wiring electrode of the present invention.
Figure 3:
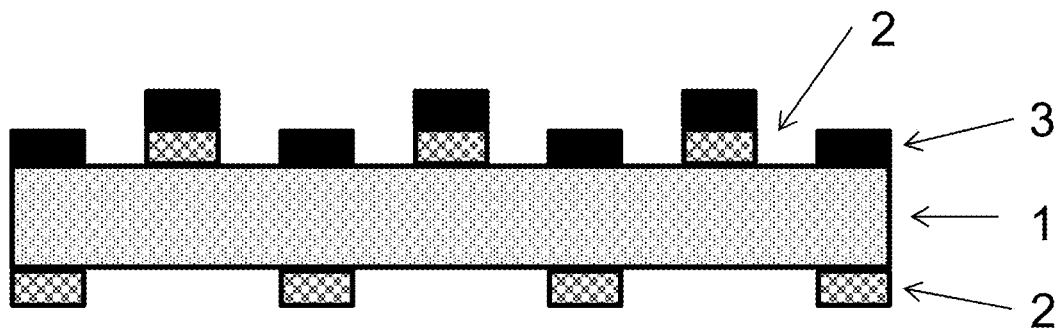
FIG. 3 is a schematic view showing still another example of the configuration of the substrate equipped with a wiring electrode of the present invention.
Figure 4:
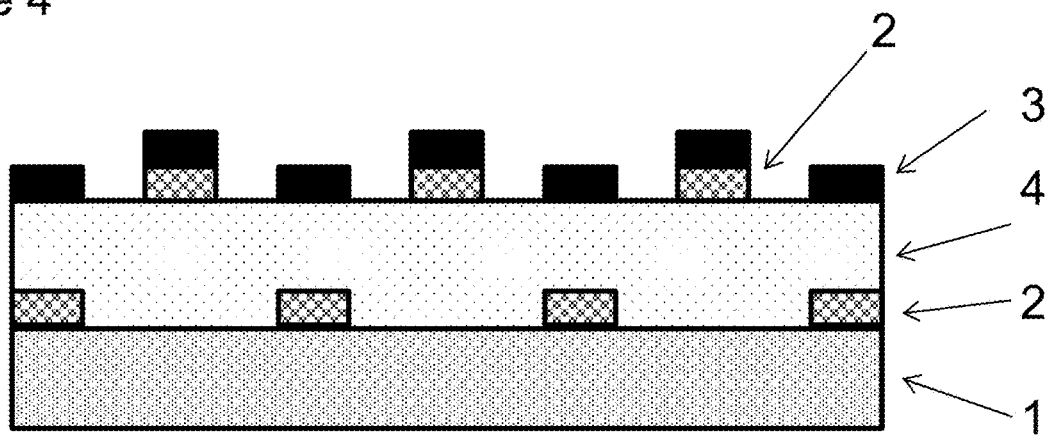
FIG. 4 is a schematic view showing yet another example of the configuration of the substrate equipped with a wiring electrode of the present invention.
Figure 5:
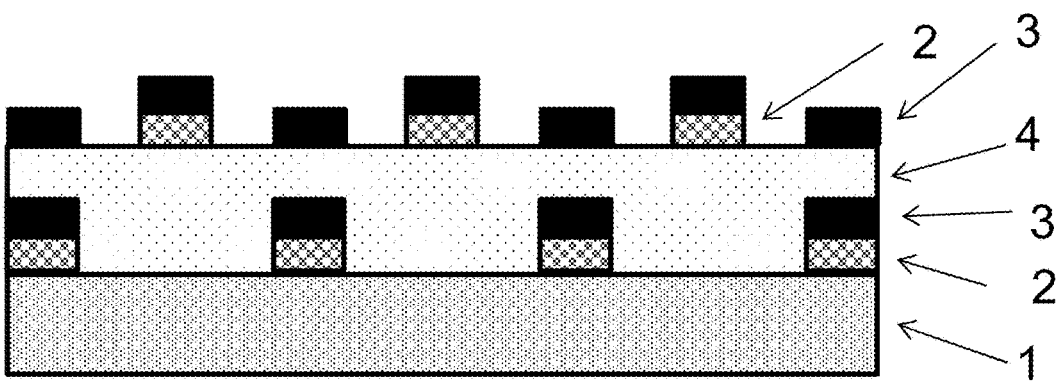
FIG. 5 is a schematic view showing a further example of the configuration of the substrate equipped with a wiring electrode of the present invention.

FIGS. 1 to 5 each show a schematic view of an example of a configuration of the substrate equipped with a wiring electrode of the present invention. FIG. 1 is a schematic view of a substrate equipped with a wiring electrode having an opaque wiring electrode 2 on a transparent substrate 1 and a functional layer 3 on the opaque wiring electrode 2. The substrate equipped with a wiring electrode shown in FIG. 1 can be obtained through a step of performing exposure from a side opposite to an opaque wiring electrode formation surface of the transparent substrate in the first manufacturing method described later. FIG. 2 is a schematic view of the substrate equipped with a wiring electrode having the opaque wiring electrode 2 below the transparent substrate 1 and the functional layer 3 on the transparent substrate 1. The substrate equipped with a wiring electrode shown in FIG. 2 can be obtained through a step of performing exposure from the opaque wiring electrode formation surface side of the transparent substrate in the first manufacturing method described later. FIG. 3 is a schematic view of a substrate equipped with a wiring electrode having the opaque wiring electrode 2 on both sides of the transparent substrate 1 and the functional layer 3 on the opaque wiring electrode 2 on one side of the transparent substrate 1. The substrate equipped with a wiring electrode shown in FIG. 3 can be obtained through a step of performing exposure from a side opposite to a positive photosensitive composition coated surface of the transparent substrate in the first manufacturing method described later. FIG. 4 is a schematic view of a substrate equipped with a wiring electrode having the opaque wiring electrode 2 (first opaque wiring electrode) and an insulating layer 4 on the transparent substrate 1, having the opaque wiring electrode 2 (second opaque wiring electrode) on the insulating layer 4, and further having the functional layer 3 at a portion corresponding to the opaque wiring electrode 2 (the first opaque wiring electrode and the second opaque wiring electrode). The substrate equipped with a wiring electrode shown in FIG. 4 can be obtained through a step of forming the first opaque wiring electrode, the insulating layer, and the second opaque wiring electrode on one side of the transparent substrate, applying the positive photosensitive composition, and performing exposure from the side opposite to the opaque wiring electrode formation surface of the transparent substrate in the first manufacturing method described later. FIG. 5 is a schematic view of a substrate equipped with a wiring electrode having the opaque wiring electrode 2 (first opaque wiring electrode), the functional layer 3 (first light shielding layer), and an insulating layer 4 on the transparent substrate 1, having the opaque wiring electrode 2 (second opaque wiring electrode) on the insulating layer 4, and further having the functional layer 3 at a portion corresponding to the opaque wiring electrode 2 (the first opaque wiring electrode and the second opaque wiring electrode). The substrate equipped with a wiring electrode shown in FIG. 5 can be obtained through a step of forming the first opaque wiring electrode, a first functional layer, the insulating layer, and the second opaque wiring electrode on one side of the transparent substrate, further applying the positive photosensitive composition, and performing exposure from the side opposite to the opaque wiring electrode formation surface of the transparent substrate in the first manufacturing method described later.

Figure 6:
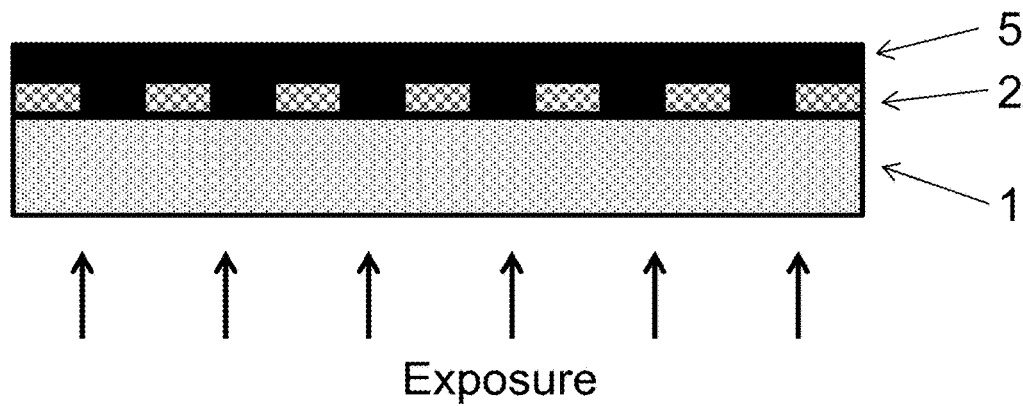
FIG. 6 is a schematic view showing an example of a first method for manufacturing the substrate equipped with a wiring electrode of the present invention.

Next, each step in the first method for manufacturing a substrate equipped with a wiring electrode of the present invention will be described in detail. FIG. 6 shows a schematic view of an example of the first method for manufacturing the substrate equipped with a wiring electrode of the present invention.

First, the opaque wiring electrode 2 is formed on at least one side of the transparent substrate 1. The opaque wiring electrodes may be formed on both sides of the transparent substrate. The step of forming the opaque wiring electrode on at least one side of the transparent substrate may include a step of forming a first opaque wiring electrode on one side of the transparent substrate, a step of forming an insulating layer on the first opaque wiring electrode, and a step of forming a second opaque wiring electrode on the insulating layer.

Examples of a method of forming the opaque wiring electrode include a method of forming a pattern by a photolithographic method using the above-mentioned photosensitive conductive composition, a method of forming a pattern by screen printing, gravure printing, inkjet printing, etc. using a conductive composition (conductive paste), and a method of forming a film of a metal, a metal complex, a complex of a metal and a metal compound, a metal alloy or the like and performing formation by a photolithographic method using a resist. Among these methods, since fine wiring can be formed, the formation method by the photolithographic method using a photosensitive conductive composition is preferable. When the opaque wiring electrodes are formed on both sides of the transparent substrate, or when two or more layers of the opaque wiring electrodes are formed via an insulating layer, the respective opaque wiring electrodes may be formed by the same method, or different methods may be combined. An insulating layer may be formed on the opaque wiring electrode of the obtained substrate equipped with the opaque wiring electrode.

Examples of the method of forming the insulating layer include a method of applying and drying an insulating composition (insulating paste), and a method of bonding a transparent substrate to the opaque wiring electrode formation surface side via an adhesive. In the latter case, the adhesive and the transparent substrate serve as the insulating layer. Examples of the method of applying the insulating paste include spin coating by a spinner, spray coating, roll coating and screen printing, offset printing, gravure printing, letterpress printing, flexo printing, and coating by a blade coater, a die coater, a calender coater, a meniscus coater or a bar coater. Among these methods, screen printing is preferable because surface flatness of the insulating layer is excellent and film thickness is easily adjusted by selection of a screen plate. In the method of applying and drying the insulating paste, a dried film can be cured by UV treatment and/or heat treatment. As the method of bonding the transparent substrate via an adhesive, for example, the adhesive may be formed on a substrate equipped with an opaque wiring electrode, and the transparent substrate may be bonded, or a transparent substrate with an adhesive may be bonded. Examples of the transparent substrate to be bonded include those described above as the transparent substrate.

The insulating paste preferably contains, for example, a resin imparting insulation, such as an acrylic resin, a polyimide resin, a cardo resin, an epoxy resin, a melamine resin, a urethane resin, a silicon resin, and a fluorine resin. Two or more of those colorants may be contained.

Next, the positive photosensitive composition 5 is applied to one side of the transparent substrate 1. The positive photosensitive composition 5 may be applied to the opaque wiring electrode formation surface of the transparent substrate or the side opposite to the opaque wiring electrode formation surface. When the positive photosensitive composition is applied to the side opposite to the opaque wiring electrode formation surface, the order of the step of forming the opaque wiring electrode and the step of applying the positive photosensitive composition is not limited.

Examples of the method of applying the positive photosensitive composition include spin coating by a spinner, spray coating, roll coating and screen printing, offset printing, gravure printing, letterpress printing, flexo printing, and coating by a blade coater, a die coater, a calender coater, a meniscus coater or a bar coater. Among these methods, screen printing is preferable because surface flatness of a positive photosensitive composition film to be obtained is excellent and film thickness is easily adjusted by selection of a screen plate. When the substrate equipped with a wiring electrode of the present invention is used as a touch panel sensor, if necessary, the positive photosensitive composition may not be applied to a connection with a flexo-substrate.

When the positive photosensitive composition contains a solvent, it is preferable to dry the applied positive photosensitive composition film and volatilize and remove the solvent. Examples of the drying method include heat drying and vacuum drying. The heating and drying apparatus may be one that heats by electromagnetic waves or microwaves, and examples thereof include an oven, a hot plate, an electromagnetic ultraviolet lamp, an infrared heater, and a halogen heater. The heating temperature is preferably 50° C. or more and more preferably 70° C. or more, from the viewpoint of suppressing remaining of the solvent. On the other hand, the heating temperature is preferably 150° C. or less and more preferably 110° C. or less, from the viewpoint of suppressing deactivation of the photosensitizer (dissolution inhibitor). The heating time is preferably 1 minute to several hours and more preferably 1 minute to 50 minutes.

The coating thickness of the positive photosensitive composition is preferably 0.1 μm or more, more preferably 0.5 μm or more, and still more preferably 1 μm or more. On the other hand, the coating thickness is preferably 20 μm or less, more preferably 10 μm or less, and still more preferably 5 μm or less. Here, when the positive photosensitive composition contains a solvent, the coating thickness refers to a film thickness after drying.

Next, the positive photosensitive composition 5 is exposed and developed using the opaque wiring electrode 2 as a mask to form a light shielding layer at a portion corresponding to the opaque wiring electrode. By the exposure using the opaque wiring electrode as a mask, a light shielding layer corresponding to the portion corresponding to the opaque wiring electrode can be formed without requiring a separate exposure mask. When the step of forming the opaque wiring electrode on at least one side of the above-mentioned transparent substrate may include the step of forming a first opaque wiring electrode on one side of the transparent substrate, the step of forming an insulating layer on the first opaque wiring electrode, and the step of forming a second opaque wiring electrode on the insulating layer, it is preferable to form a light shielding layer at a portion corresponding to the first opaque wiring electrode and the second opaque wiring electrode. It is preferable to perform exposure from the side opposite to the positive photosensitive composition coated surface irrespective of an opaque wiring electrode formation surface.

It is preferable that emission of exposure light be observed in an ultraviolet region that matches an absorption wavelength of a photosensitizer (dissolution inhibitor) contained in the positive photosensitive composition, that is, in a wavelength region of 200 nm to 450 nm. Examples of a light source for obtaining such exposure light include a mercury lamp, a halogen lamp, a xenon lamp, an LED lamp, a semiconductor laser, and KrF and ArF excimer lasers. Among these light sources, an i-line (wavelength 365 nm) of the mercury lamp is preferable. The exposure dose is preferably 50 mJ/cm$^2$ or more, more preferably 100 mJ/cm$^2$ or more, and still more preferably 200 mJ/cm$^2$ or more in terms of a wavelength of 365 nm, from the viewpoint of solubility of an exposed portion in a developer.

By developing the coating film of the exposed positive photosensitive composition, the exposed portion can be removed, and a light shielding layer can be formed at a portion corresponding to the opaque wiring electrode. As a developer, one which does not inhibit the conductivity of the opaque wiring electrode is preferable, and an alkali developer is preferable.

Examples of the alkali developer include aqueous solutions of an alkaline substance such as tetramethylammonium hydroxide, diethanolamine, diethylamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine. To these aqueous solutions may be added a polar solvent such as N-methyl-2-pyrrolidone, N,N-dimethylformamide, N,N-dimethylacetamide, dimethyl sulfoxide, or γ-butyrolactone; an alcohol such as methanol, ethanol, or isopropanol; an ester such as ethyl lactate or propylene glycol monomethyl ether acetate; a ketone such as cyclopentanone, cyclohexanone, isobutyl ketone, or methyl isobutyl ketone; or a surfactant.

Examples of a developing method include a method of spraying a developer onto a surface of a coating film of a positive photosensitive composition while leaving to stand, rotating, or transporting a substrate formed with the coating film of the positive photosensitive composition, a method of immersing a coating film of a positive photosensitive composition in a developer, and a method of applying an ultrasonic wave while immersing a coating film of a positive photosensitive composition in a developer.

A pattern obtained by development may be subjected to a rinsing treatment with a rinsing liquid. Examples of the rinsing liquid include water; aqueous solutions of alcohols such as ethanol and isopropyl alcohol; and aqueous solutions of esters such as ethyl lactate and propylene glycol monomethyl ether acetate.

The obtained light shielding layer may be further heated at 100° C. to 250° C. Heating can improve the hardness of the light shielding layer to suppress chipping and peeling due to contact with other members, and thus to improve adhesion to the opaque wiring electrode. As a heating apparatus, one exemplified as the heating and drying apparatus for a positive photosensitive composition film is mentioned.

The manufacturing method may include a step of forming an insulating layer on a light shielding layer of the obtained substrate equipped with a wiring electrode, a step of forming a second opaque wiring electrode on the insulating layer, and a step of applying a positive photosensitive composition to a second opaque wiring electrode formation surface to expose and develop the positive photosensitive composition from a side opposite to the second opaque wiring electrode formation surface of a transparent substrate, and thus to form a light shielding layer at a portion corresponding to at least the second opaque wiring electrode.

A second method for manufacturing a substrate equipped with a wiring electrode of the present invention include a step of forming a pattern of a light shielding layer on one side of a transparent substrate, a step of applying a positive photosensitive conductive composition to one side of the transparent substrate, and a step of exposing and developing the positive photosensitive conductive composition using the light shielding layer as a mask to form a wiring electrode at a portion corresponding to the light shielding layer. When the pattern of the light shielding layer is formed on one side of the transparent substrate and the positive photosensitive conductive composition is exposed using the light shielding layer as a mask, the wiring electrode can be formed at the portion corresponding to the light shielding layer, and a substrate equipped with a wiring electrode which is excellent in conductivity and in which the wiring electrode is hardly visible can be obtained. When the positive photosensitive conductive composition is applied to a side opposite to a light shielding layer formation surface of the transparent substrate, the order of the step of forming a pattern on the light shielding layer and the step of applying the positive photosensitive conductive composition is not limited. The manufacturing method may further include other steps as needed.

As the transparent substrate, one exemplified as the transparent substrate in the first method for manufacturing the substrate equipped with a wiring electrode can be used.

The light shielding layer preferably has a light shielding property similar to that of the opaque wiring electrode in the first method for manufacturing the substrate equipped with a wiring electrode.

In the light shielding layer, it is preferable that the wiring electrode be formed at a corresponding portion and the reflectance of the wiring electrode be reduced. Specifically, the light shielding layer preferably has a reflectance similar to that of the light shielding layer in the first method for manufacturing the substrate equipped with a wiring electrode.

As a method of setting the reflectance of light having a wavelength of 550 nm of the light shielding layer to the above range, for example, there are a method using the above-mentioned positive photosensitive light-shielding composition and a method of setting the thickness of the light shielding layer to a preferred range described later.

The thickness of the light shielding layer is preferably 0.1 µm or more, more preferably 0.5 µm or more, and still more preferably 1 µm or more, from the viewpoint of further reducing the reflectance of the wiring electrode. On the other hand, from the viewpoint of suppressing residue and forming a finer pattern, the thickness of the light shielding layer is preferably 20 µm or less, more preferably 10 µm or less, and still more preferably 5 µm or less.

As the pattern shape of the light shielding layer, for example, the shape similar to that of the opaque wiring electrode in the first method for manufacturing the substrate equipped with a wiring electrode is preferable.

The line width of the pattern of the light shielding layer is preferably in the same range as that of the opaque wiring electrode in the first method for manufacturing the substrate equipped with a wiring electrode, from the viewpoint of further improving the conductivity of the wiring electrode formed at a portion corresponding to the light shielding layer.

As a material which forms the light shielding layer, a colorant is mentioned, for example. From the viewpoint of forming a pattern more easily, a positive or negative photosensitive light-shielding composition is preferable. In this case, the light shielding layer is made of a cured product of the positive or negative photosensitive light-shielding composition.

As the positive photosensitive light-shielding composition, one exemplified as the positive photosensitive light-shielding composition in the first method for manufacturing the substrate equipped with a wiring electrode is mentioned, for example.

The negative photosensitive light-shielding composition refers to a composition having negative photosensitivity where a non-light-irradiated part dissolves in a developer and exhibiting a light shielding property when a light shielding layer is formed. It is preferable to make the reflectance of the light shielding layer within the above-mentioned preferable range. The negative photosensitive light-shielding composition preferably contains, for example, a colorant, a photopolymerization initiator, and an alkali-soluble resin.

As the colorant, one exemplified as the colorant used in the positive photosensitive light-shielding composition in the first method for manufacturing the substrate equipped with a wiring electrode is mentioned.

Examples of the photopolymerization initiator include benzophenone derivatives, acetophenone derivatives, thioxanthone derivatives, benzyl derivatives, benzoin derivatives, oxime type compounds, α-hydroxy ketone type compounds, α-aminoalkylphenone type compounds, phosphine oxide type compounds, anthrone compounds, and anthraquinone compounds. Examples of benzophenone derivatives include benzophenone, methyl O-benzoylbenzoate, 4,4'-bis(dimethylamino) benzophenone, 4,4'-bis(diethylamino) benzophenone, 4,4'-dichlorobenzophenone, fluorenone, and 4-benzoyl-4'-methyl diphenyl ketone. Examples of the acetophenone derivative include p-t-butyldichloroacetophenone, 4-azidobenzalacetophenone, and 2,2'-diethoxyacetophenone. Examples of thioxanthone derivative include thioxanthone, 2-methyl thioxanthone, 2-chloro thioxanthone, 2-isopropyl thioxanthone, and diethyl thioxanthone. Examples of benzyl derivatives include benzyl, benzyl dimethyl ketal, and benzyl-3-methoxyethyl acetal. Examples of benzoin derivatives include benzoin, benzoin methyl ether, and benzoin butyl ether. Examples of oxime type compounds include 1,2-octanedione-1-[4-(phenylthio)-2-(O-benzoyloxime)], ethanone-1-[9-ethyl-6-(2-methylbenzoyl))-9H-carbazol-3-yl]-1-(O-acetyloxime), 1-phenyl-1,2-butanedione-2-(O-methoxycarbonyl)oxime, 1-phenyl-propanedione-2-(O-ethoxycarbonyl)oxime, 1-phenyl-propanedione-2-(O-benzoyl)oxime, 1,3-diphenyl-propanetrione-2-(O-ethoxycarbonyl)oxime, and 1-phenyl-3-ethoxy-propanetrione-2-(O-benzoyl)oxime. Examples of α-hydroxy ketone type compounds include 2-hydroxy-2-methyl-1-phenyl-propan-1-one and 1-[4-(2-hydroxyethoxy)-phenyl]-2-hydroxy-2-methyl-1-propan-1-one.

Examples of α-aminoalkylphenone type compounds include 2-methyl-(4-methylthiophenyl)-2-morpholinopropan-1-one, 2-benzyl-2-dimethylamino-1-(4-morpholinophenyl)-butan-1-one, and 2-dimethylamino-2-(4-methylbenzyl)-1-(4-morpholin-4-yl-phenyl)butan-1-one. Examples of phosphine oxide type compounds include 2,4,6-trimethylbenzoyl-diphenyl-phosphine oxide and bis(2,4,6-trimethylbenzoyl)-phenylphosphine oxide. Examples of anthrone compounds include anthrone, benzanthrone, dibenzosuberone, and methylene anthrone. Examples of anthraquinone compounds include anthraquinone, 2-t-butyl anthraquinone, 2-amyl anthraquinone, and β-chloroanthraquinone. Two or more of those colorants may be contained. Among these compounds, oxime type compounds having high photosensitivity are preferable.

The content of the photopolymerization initiator in the negative photosensitive light-shielding composition is preferably 0.05 parts by mass or more and more preferably 0.1 parts by mass or more based on 100 parts by mass of the alkali-soluble resin from the viewpoint of improving exposure sensitivity. On the other hand, the content of the photopolymerization initiator is preferably 10 parts by mass or less based on 100 parts by mass of the alkali-soluble resin from the viewpoint of suppressing excessive light absorption.

As the alkali-soluble resin, one exemplified as the alkali-soluble resin used for the positive photosensitive composition in the first method for manufacturing the substrate equipped with a wiring electrode is mentioned, for example. The alkali-soluble resin preferably has an unsaturated double bond. Examples of an alkali-soluble resin having an unsaturated double bond include the resin exemplified as the resin having a carboxyl group, which is used for the positive photosensitive composition in the first method for manufacturing the substrate equipped with a wiring electrode, and a resin which is a reaction product with a compound having an unsaturated double bond such as glycidyl (meth)acrylate and has an unsaturated double bond in its side chain The acid value of the alkali-soluble resin is preferably 50 mg KOH/g or more from the viewpoint of solubility in a developer, and is preferably 250 mg KOH/g or less from the viewpoint of suppressing excessive dissolution of an exposed portion. The acid value of the alkali-soluble resin can be measured in accordance with JIS K 0070 (1992).

The negative photosensitive light-shielding composition may contain a plasticizer, a leveling agent, a surfactant, a silane coupling agent, an antifoaming agent, a stabilizer and the like as long as desired properties of the positive photosensitive composition are not impaired. As examples thereof, one exemplified in the positive photosensitive composition in the first method for manufacturing the substrate equipped with a wiring electrode is mentioned.

The wiring electrode is formed at a portion corresponding to the light shielding layer. The pattern shape of the wiring electrode is preferably a mesh shape from the viewpoint of making conductivity of the pattern uniform. The wiring electrode is preferably a metal mesh formed of the positive photosensitive conductive composition described later and having a mesh-like pattern. The film thickness and line width of the wiring electrode are preferably is preferably in the same range as that of the above-mentioned opaque wiring electrode.

The positive photosensitive conductive composition refers to a composition having positive photosensitivity where a light-irradiated part dissolves in a developer and exhibiting conductivity when a wiring electrode is formed, and the conductivity of the wiring electrode is preferably within a preferred range described later. For example, the positive photosensitive conductive composition preferably contains conductive particles, a photosensitizer (dissolution inhibitor), and an alkali-soluble resin. The conductive particles have an effect of imparting conductivity to the wiring electrode. The alkali-soluble resin exhibits solubility in an alkali developer and has an effect of enabling pattern processing by development. The photosensitizer (dissolution inhibitor) has an effect of providing a difference in solubility in a developer between an unexposed portion and an exposed portion by changing with light.

As conductive particles, those exemplified as conductive particles in the opaque wiring electrode in the first method for manufacturing the substrate equipped with a wiring electrode are preferable.

The content of conductive particles in the positive photosensitive conductive composition is preferably 65% by mass or more and more preferably 70% by mass or more based on the total solid content, from the viewpoint of further improving the conductivity of the wiring electrode. On the other hand, the content of conductive particles in the positive photosensitive conductive composition is preferably 90% by mass or less and more preferably 85% by mass or less based on the total solid content, from the viewpoint of forming finer wiring.

As the photosensitizer (dissolution inhibitor), one exemplified as the photosensitizer (dissolution inhibitor) in the first method for manufacturing the substrate equipped with a wiring electrode is mentioned.

The content of the photosensitizer (dissolution inhibitor) in the positive photosensitive conductive composition is preferably in the same range as that of the positive photosensitive composition in the first method for manufacturing the substrate equipped with a wiring electrode.

As the alkali-soluble resin, one exemplified as the alkali-soluble resin in the positive photosensitive composition in the first method for manufacturing the substrate equipped with a wiring electrode is mentioned, for example.

The positive photosensitive conductive composition may contain a thermosetting compound. Since hardness of the wiring electrode is improved by containing the thermosetting compound, chipping and peeling due to contact with other members can be suppressed, and adhesion to the light shielding layer can be improved. Examples of the thermosetting compound include monomers, oligomers and polymers having an epoxy group.

The positive photosensitive conductive composition preferably contains a solvent, and the viscosity of the composition can be adjusted to a desired range. As the solvent, one exemplified as the solvent in the positive photosensitive composition in the first method for manufacturing the substrate equipped with a wiring electrode is mentioned, for example.

The positive photosensitive conductive composition may contain a plasticizer, a leveling agent, a surfactant, a silane coupling agent, an antifoaming agent, a stabilizer and the like as long as desired properties of the positive photosensitive conductive composition are not impaired. As examples thereof, one exemplified in the positive photosensitive composition in the first method for manufacturing the substrate equipped with a wiring electrode is mentioned.

Figure 8:
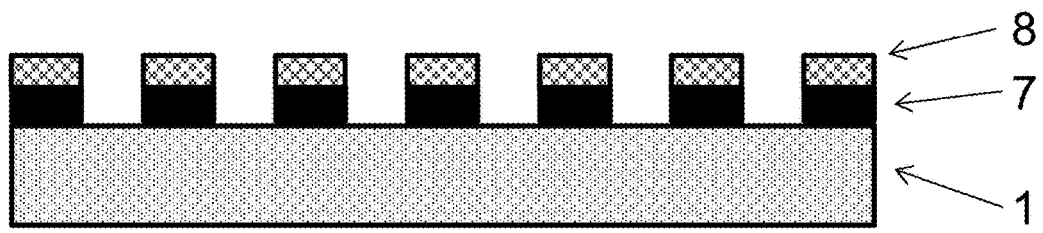
FIG. 8 is a schematic view showing a still further example of the configuration of the substrate equipped with a wiring electrode of the present invention.
Figure 9:
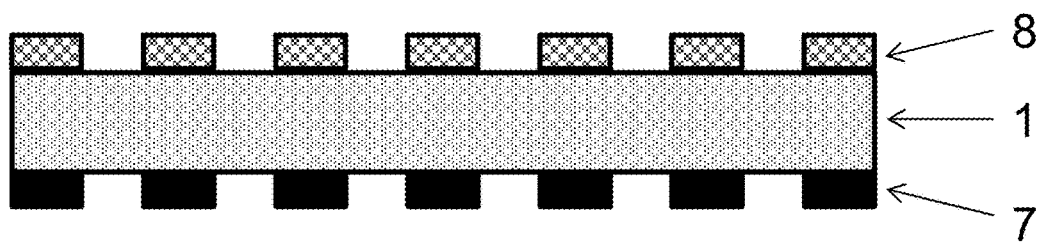
FIG. 9 is a schematic view showing a yet further example of the configuration of the substrate equipped with a wiring electrode of the present invention.
Figure 10:
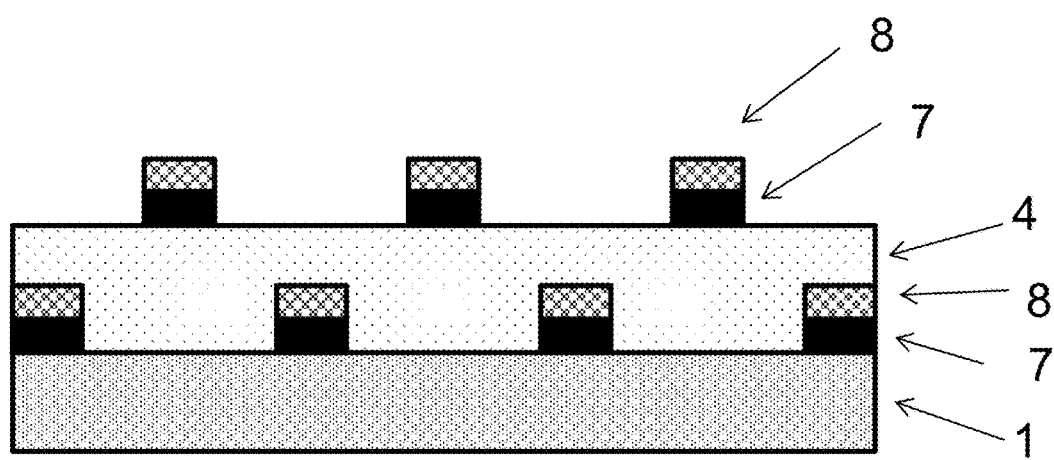
FIG. 10 is a schematic view showing a still yet further example of the configuration of the substrate equipped with a wiring electrode of the present invention.

FIGS. 8 to 10 each show a schematic view of an example of the configuration of the substrate equipped with a wiring electrode of the present invention. FIG. 8 is a schematic view of a substrate equipped with a wiring electrode having a light shielding layer 7 on the transparent substrate 1 and having a wiring electrode 8 on the light shielding layer 7. The substrate equipped with a wiring electrode shown in FIG. 8 can be obtained through a step of performing exposure from a side opposite to a light shielding layer formation surface of the transparent substrate in the second manufacturing method described later. FIG. 9 is a schematic view of a substrate equipped with a wiring electrode having the light shielding layer 7 below the transparent substrate 1 and having the wiring electrode 8 on the transparent substrate 1. The substrate equipped with a wiring electrode shown in FIG. 9 can be obtained through a step of performing exposure from the light shielding layer formation surface side of the transparent substrate in the second manufacturing method described later. FIG. 10 is a schematic view of a substrate equipped with a wiring electrode having the light shielding layer 7 (first light shielding layer), the wiring electrode 8 (first wiring electrode) and the insulating layer 4 on the transparent substrate 1 and having the light shielding layer 7 (second light shielding layer) and the wiring electrode 8 (second wiring electrode) on the insulating layer 4. The substrate equipped with a wiring electrode shown in FIG. 11 can be obtained through a step of forming the first light shielding layer, the first wiring electrode, the insulating layer, and the second light shielding layer on one side of a transparent substrate, further applying a positive photosensitive conductive composition, and performing exposure from a side opposite to the light shielding layer formation surface of the transparent substrate in the second manufacturing method described later.

Figure 11:
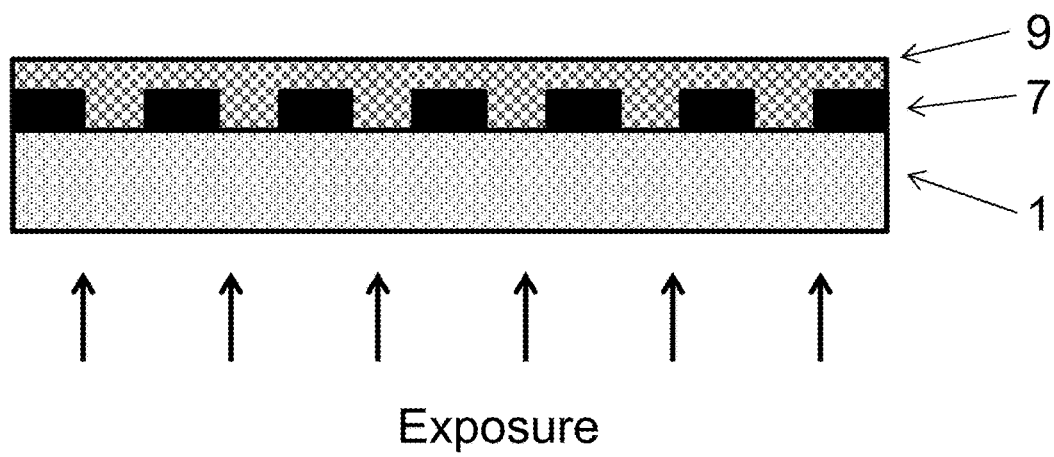
FIG. 11 is a schematic view showing another example of a second method for manufacturing the substrate equipped with a wiring electrode of the present invention.
Figure 12:
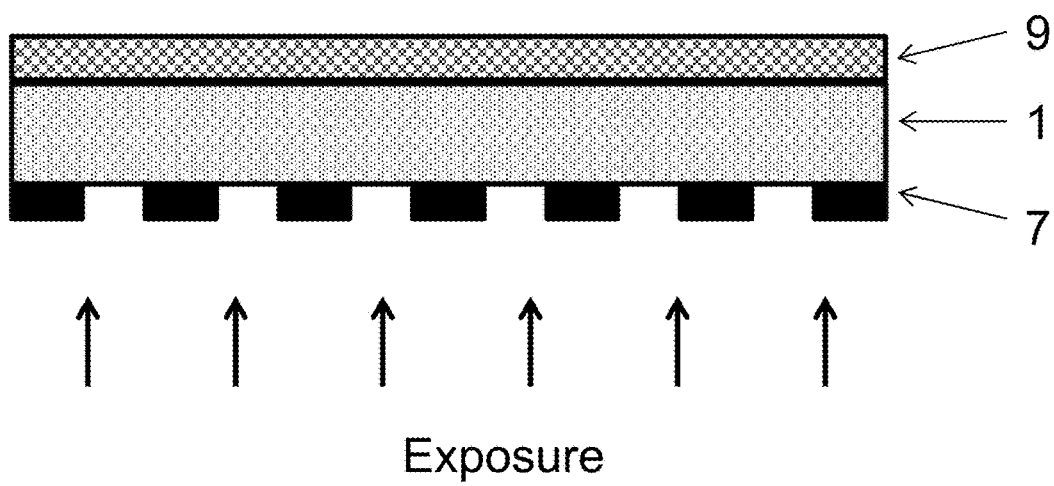
FIG. 12 is a schematic view showing still another example of the second method for manufacturing the substrate equipped with a wiring electrode of the present invention.

Next, each step in the second method for manufacturing the substrate equipped with a wiring electrode of the present invention will be described in detail. FIGS. 11 and 12 each show a schematic view of an example of the second method for manufacturing the substrate equipped with a wiring electrode of the present invention.

First, the light shielding layer 7 is formed on one side of the transparent substrate 1. Examples of a method of forming the light shielding layer include a method of forming a pattern by a photolithographic method using a negative or positive photosensitive light-shielding composition, a method of forming a pattern by screen printing, gravure printing, inkjet printing, etc. using a light-shielding composition, and a method of forming a film of a metal oxide or the like and performing formation by a photolithographic method using a resist. Among these methods, since fine wiring can be formed, the formation method by the photolithographic method using a photosensitive light-shielding composition is preferable.

Next, a positive photosensitive conductive composition 9 is applied to one side of the transparent substrate 1. The positive photosensitive conductive composition may be applied to the light shielding layer formation surface of the transparent substrate as shown in FIG. 11 or may be applied to the side opposite to the light shielding layer formation surface as shown in FIG. 12. When the positive photosensitive conductive composition is applied to the side opposite to the light shielding layer formation surface, the order of the step of forming the light shielding layer and the step of applying the positive photosensitive conductive composition is not limited.

As a method of applying the positive photosensitive conductive composition, for example, there is the same method as the method of applying the positive photosensitive composition in the above-mentioned first method for manufacturing the substrate equipped with a wiring electrode.

When the positive photosensitive conductive composition contains a solvent, it is preferable to dry an applied positive photosensitive conductive composition layer and volatilize and remove the solvent. As a drying method, for example, there is the same method as the positive photosensitive composition in the first method for manufacturing the substrate equipped with a wiring electrode.

The coating thickness of the positive photosensitive conductive composition is preferably 0.5 μm or more, more preferably 0.7 μm or more, and still more preferably 1 μm or more from the viewpoint of further improving the conductivity. On the other hand, the coating thickness of the positive photosensitive conductive composition is preferably 7 μm or less, more preferably 5 μm or less, and still more preferably 3 μm or less, from the viewpoint of forming finer wiring. Here, when the positive photosensitive conductive composition contains a solvent, the coating thickness refers to a film thickness after drying.

Next, the positive photosensitive conductive composition 9 is exposed and developed using the light shielding layer 7 as a mask to form the wiring electrode 8 at a portion corresponding to the light shielding layer. By the exposure using the light shielding layer as a mask, a wiring electrode corresponding to the portion corresponding to the light shielding layer can be formed without requiring a separate exposure mask. It is preferable to perform exposure from the side opposite to a coated surface of the positive photosensitive conductive composition irrespective of the light shielding layer formation surface.

The exposure light is preferably the one exemplified as the exposure light in the first method for manufacturing the substrate equipped with a wiring electrode.

By developing the coating film of the exposed positive photosensitive conductive composition, the exposed portion can be removed, and a wiring electrode can be formed at a portion corresponding to the light shielding layer. As the developer, an alkali developer is preferable.

As the alkali developer, one exemplified as the alkali developer in the first method for manufacturing the substrate equipped with a wiring electrode is mentioned, for example.

As a developing method, a method exemplified as the developing method in the first method for manufacturing the substrate equipped with a wiring electrode is mentioned, for example.

A pattern obtained by development may be subjected to a rinsing treatment with a rinsing liquid. As the rinsing liquid, one exemplified as the rinsing liquid in the first method for manufacturing the substrate equipped with a wiring electrode is mentioned, for example.

The obtained wiring electrode may be further heated at 100° C. to 250° C. By heating, sintering in a contact portion between conductive particles can be more effectively progressed, and the conductivity of the wiring electrode to be obtained can be further improved. The heating temperature is more preferably 120° C. or more from the viewpoint of progressing sintering more effectively. On the other hand, the heating temperature is more preferably 200° C. or less and still more preferably 150° C. or less, from the viewpoint of enhancing the freedom of selection of the transparent substrate.

The manufacturing method may include a step of forming an insulating layer on a wiring electrode of the obtained substrate equipped with a wiring electrode, a step of forming a second light shielding layer on the insulating layer, and a step of applying a positive photosensitive conductive composition onto the second light shielding layer to expose and develop the positive photosensitive conductive composition from a side opposite to a second light shielding layer formation surface of a transparent substrate, and thus to form a wiring electrode at a portion corresponding to the second light shielding layer.

As a method of forming the insulating layer, a method exemplified as the method of forming the insulating layer in the first method for manufacturing the substrate equipped with a wiring electrode is mentioned, for example.

The substrate equipped with a wiring electrode to be obtained by the manufacturing method of the present invention can be suitably used for applications where it is necessary for the wiring electrode to be hardly visible. As applications where suppression of visual recognition of a wiring electrode is especially required, members for touch panels, members for electromagnetic shielding, and members for transparent LED lights are mentioned, for example. Among these applications, the substrate equipped with a wiring electrode can be suitably used as a member for a touch panel which is more highly required to be miniaturized and to make it hard to visually recognize the wiring electrode.

EXAMPLES

The present invention will be described more in detail with reference to Examples; however, the present invention is not limited by Examples.

Materials used in Examples are as follows. The transmittance of the transparent substrate at a wavelength of 365 nm was measured using an ultraviolet-visible spectrophotometer (U-3310 manufactured by Hitachi High-Technologies Corporation).

(Transparent Substrate)
- "Lumirror (registered trademark)" T60 (manufactured by Toray Industries, Inc.) (thickness: 100 µm, wavelength: 365 nm transmittance: 85%) (a-1)
- "ZEONEX (registered trademark)" 480 (manufactured by Zeon Corporation) (thickness: 100 µm, wavelength: 365 nm, transmittance: 90%) (a-2).

Production Example 1: Carboxyl Group-Containing Acrylic Copolymer (d-1)

In a reaction vessel under a nitrogen atmosphere, 150 g of diethylene glycol monoethyl ether acetate (hereinafter referred to as "DMEA") was charged, and the temperature was raised to 80° C. using an oil bath. To this was added dropwise for 1 hour a mixture including 20 g of ethyl acrylate (hereinafter referred to as "EA"), 40 g of 2-ethylhexyl methacrylate (hereinafter referred to as "2-EHMA"), 20 g of styrene (hereinafter referred to as "St"), 15 g of acrylic acid (hereinafter referred to as "AA"), 0.8 g of 2,2'-azobisisobutyronitrile and 10 g of diethylene glycol monoethyl ether acetate. After completion of the dropwise addition, the mixture was further stirred for 6 hours to carry out a polymerization reaction. 1 g of hydroquinone monomethyl ether was then added to terminate the polymerization reaction. Subsequently, a mixture containing 5 g of glycidyl methacrylate (hereinafter referred to as "GMA"), 1 g of triethylbenzeneammonium chloride, and 10 g of DMEA was then added dropwise for 0.5 hours. After completion of the dropwise addition, the mixture was further stirred in the reaction vessel for 2 hours to carry out an addition reaction. The obtained reaction solution was refined with methanol to remove unreacted impurities, and dried under vacuum for 24 hours to obtain a carboxyl group-containing acrylic copolymer (d-1) having a copolymerization ratio (based on mass) of EA/2-EHMA/St/GMA/AA=20/40/20/5/15. When the acid value of the obtained copolymer was measured, the acid value was 103 mg KOH/g. The acid value was measured in accordance with JIS K 0070 (1992).

Production Example 2: Photosensitive Conductive Paste 17.5 g of the carboxyl group-containing acrylic copolymer (d-1) produced in Production Example 1, 0.5 g of photopolymerization initiator N-1919 (manufactured by ADEKA Corporation), 1.5 g of epoxy resin "Adeka Resin (registered trademark)" EP-4530 (epoxy equivalent 190, manufactured by ADEKA Corporation), 3.5 g of monomer "Light Acrylate (registered trademark)" BP-4EA (manufactured by Kyoeisha Chemical Co., Ltd.), and 19.0 g of DMEA were placed in a 100 mL clean bottle and mixed by using "Awatori Rentaro (registered trademark)" ARE-310 (manufactured by Thinky) to produce 42.0 g of resin solution. The obtained resin solution in an amount of 42 g and 62.3 g of Ag particles having a volume particle size of 0.3 µm were mixed together, and kneaded using a three-roll mill EXAKT M50 (manufactured by EXAKT), 7 g of DMEA was then added, and the mixture was mixed to obtain 111 g of a photosensitive conductive paste. The viscosity of the photosensitive conductive paste was 10,000 mPa·s. The viscosity was measured using a Brookfield viscometer at a temperature of 25° C. and a rotational speed of 3 rpm.

Production Example 3: Quinonediazide Compound (c)

In a dry nitrogen stream, 21.22 g (0.05 mol) of α,α-bis (4-hydroxyphenyl)-4-(4-hydroxy-α,α-dimethyldimethylbenzylethyl benzene (trade name: TrisP-PA, produced by Honshu Chemical Industry Co., Ltd.) and 33.58 g (0.125 mol) of 5-naphthoquinonediazidosulfonylchloride were dissolved in 450 g of 1,4-dioxane, and the temperature was brought to room temperature. 15.18 g of triethylamine mixed with 50 g of 1,4-dioxane was dropped here so that the temperature of the system did not become 35° C. or more. After completion of the dropping, the mixture was stirred at 30° C. for 2 hours. A triethylamine salt was filtered, and the filtrate was charged into water. Thereafter, the resulting precipitate was collected by filtration. This precipitate was dried in a vacuum drier to obtain a quinonediazide compound (c).

Production Example 4: Carboxyl Group-Containing Acrylic Copolymer (d-2)

In a reaction vessel under a nitrogen atmosphere, 150 g of 2-methoxy-1-methylethyl acetate (hereinafter referred to as "PMA") was charged, and the temperature was raised to 80° C. using an oil bath. To this was added dropwise for 1 hour a mixture including 20 g of EA, 20 g of 2-EHMA, 20 g of 4-hydroxystyrene (hereinafter referred to as "HS"), 15 g of N-methylol acrylamide (hereinafter referred to as "MAA"), 25 g of AA, 0.8 g of 2,2'-azobisisobutyronitrile and 10 g of PMA. After completion of the dropwise addition, the mixture was further heated and stirred at 80° C. for 6 hours to carry out a polymerization reaction. 1 g of hydroquinone monomethyl ether was then added to terminate the polymerization reaction. The obtained reaction solution was refined with methanol to remove unreacted impurities, and dried under vacuum for 24 hours to obtain a carboxyl group-containing acrylic copolymer (d) having a copolymerization ratio (based on mass) of EA/2-EHMA/HS/MAA/AA=20/20/20/15/25. When the acid value was measured as in Production Example 1, the acid value was 153 mg KOH/g.

Production Example 5: Insulating Paste (e)

20.0 g of polymer-type acrylate "UNIDIC (registered trademark)" V6840, 0.5 g of photopolymerization initiator "IRGACURE (registered trademark)" 184, and 10.0 g of isobutyl ketone were placed in a 100 mL clean bottle and mixed by using "Awatori Rentaro (registered trademark)" ARE-310 (manufactured by Thinky) to produce 30.5 g of insulating paste (e).
(Colorant)
Activated carbon powder (Cas No. 7440-44-0 manufactured by Tokyo Chemical Industry Co., Ltd.) (b-1)
VALIFAST BLACK 1807 (manufactured by Orient Chemical Industries Co., Ltd.) (b-2).

Evaluations in Examples and Comparative Examples were performed by the following methods.

(1) Visibility (Less Easy Visual Recognition) (Visual Observation)

Figure 7:
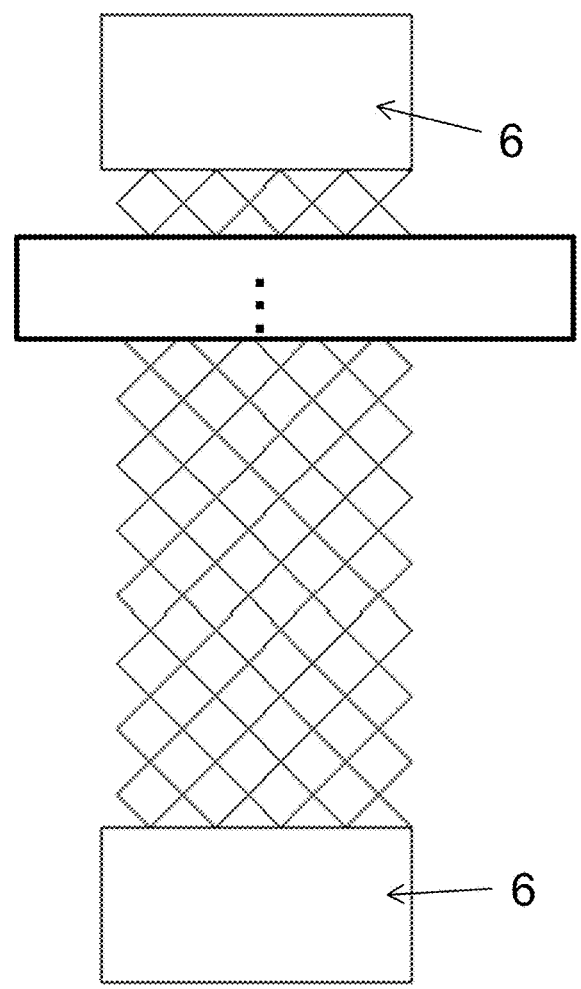
FIG. 7 is a schematic view showing an electrode pattern for evaluating visibility and conductivity in Examples and Comparative Examples.

A substrate equipped with a wiring electrode having a pattern for visibility and conductivity evaluation shown in FIG. 7, which was obtained in each of Examples and Comparative Examples was placed on a black film such that the light shielding layer side could be seen with respect to the wiring electrode, and light was projected by a light projector. 10 people visually observed from a position 30 cm away and evaluated whether a mesh-like electrode part was visible or not. However, in Comparative Examples 11 to 12, evaluation was performed from a side opposite to a wiring electrode formation surface of the substrate equipped with a wiring electrode. When 7 or more people determined that the mesh-like electrode part was visible, it was evaluated as "D". When 4 or more and less than 7 people determined that the mesh-like electrode part was visible, it was evaluated as "C". When 1 or more and less than 4 people determined that the mesh-like electrode part was visible, it was evaluated as "B". When 10 people determined that the mesh-like electrode part was not visible, it was evaluated as "A."

(2) Visibility (Less Easy Visual Recognition) (Reflectance)

In the light shielding layer of the substrate equipped with a wiring electrode having the pattern for visibility and conductivity evaluation shown in FIG. 7, which was obtained in each of Examples and Comparative Examples, the reflectance at a wavelength of 550 nm at a portion corresponding to a pad portion 6 was measured using a reflectometer (VSR400: manufactured by Nippon Denshoku Industries Co., Ltd.).

(3) Fine Processability (Light Shielding Layer Line Width)

In the substrates equipped with a wiring electrode obtained in Examples 1 to 15 and Comparative Examples 1 to 4, a light shielding layer corresponding to an opaque wiring electrode was observed with an optical microscope. The line widths of 10 randomly selected points were measured, and the average value was calculated. In the substrates equipped with a wiring electrode obtained in Examples 21 to 33 and Comparative Examples 11 and 12, the obtained wiring electrode was observed with an optical microscope. The line widths of 10 randomly selected points were measured, and the average value was calculated.

(4) Conductivity

In a substrate equipped with an opaque wiring electrode and a substrate equipped with a wiring electrode having the pattern for visibility and conductivity evaluation shown in FIG. 7, which was obtained in each of Examples and Comparative Examples, a resistance value between terminals was measured using a resistance measuring tester (2407A; manufactured by BK Precision). A distance between the terminals was 20 mm, the width was 2 mm, and the pad portion 6 had a square shape of 4 mm². In Examples 1 to 14 and Comparative Examples 1 to 4, the resistance value change before and after the formation of the light shielding layer of the opaque wiring electrode was calculated. When the resistance value change was 110% or less, it was evaluated as "B". When the resistance value change was 110 to 200%, it was evaluated as "C". When the resistance value change was 200% or more, it was evaluated as "D". However, in Examples 12, 14 and 15, two layers of the opaque wiring electrodes were evaluated, respectively, and evaluated based on the ones having a large resistance value change. In Comparative Examples 3 and 4, evaluation was performed based on the resistance value change before and after blackening treatment. In Examples 21 to 33 and Comparative Examples 11 to 12, the resistance value of the wiring electrode was measured. When the resistance value was 1000Ω or less, it was evaluated as "B". When the resistance value was more than 1000Ω and less than 2000Ω, it was evaluated as "C". When the resistance value was 2000Ω or more, it was evaluated as "D". However, in Example 33, two layers of the wiring electrodes were evaluated, respectively, and evaluated based on the ones having a large resistance value.

Example 1

<Formation of Opaque Wiring Electrode>

The photosensitive conductive paste obtained in Production Example 2 was printed on one side of the transparent substrate (a-1) by screen printing so as to have a film thickness of 1 μm after drying, and dried at 100° C. for 10 minutes. The resultant dried film was exposed at an exposure amount of 500 mJ/cm² (in terms of a wavelength of 365 nm) by exposure equipment (PEM-6M; manufactured by UNION OPTICAL CO., LTD.) through an exposure mask having a mesh-shaped pattern with a pitch of 300 μm shown in FIG. 7. The mask opening width was 3 μm. Thereafter, immersion development was performed with a 0.2 mass % sodium carbonate aqueous solution for 30 seconds, rinsed with ultrapure water, and then heated in an IR heater furnace at 140° C. for 30 minutes to obtain a substrate equipped with an opaque wiring electrode. As a result of measuring the line width of the opaque wiring electrode with an optical microscope, the line width was 4 μm. In the pattern for visibility and conductivity evaluation shown in FIG. 7, the transmittance of the opaque wiring electrode of the pad portion 6 at a wavelength of 365 nm was 5%. The transmittance of the opaque wiring electrode was measured by a microscopic area spectroscopic color difference meter (VSS 400: manufactured by Nippon Denshoku Industries Co., Ltd.).

<Positive Photosensitive Light-Shielding Composition>

20.0 g of carboxyl group-containing acrylic copolymer (d) obtained in Production Example 4, 6.0 g of quinone diazide compound (c) obtained in Production Example 3, 1.0 g of colorant (b-1), and 20.0 g of DMEA were placed in a 100 mL clean bottle and mixed by using "Awatori Rentaro (registered trademark)" ARE-310 (manufactured by Thinky) to produce 47.0 g of positive photosensitive light-shielding composition.

<Formation of Light Shielding Layer>

The positive photosensitive light-shielding composition obtained by the above method was printed on an opaque wiring electrode formation surface of the obtained substrate equipped with an opaque wiring electrode by screen printing so as to have a film thickness of 2 μm after drying, and dried at 100° C. for 10 minutes, thus obtaining a substrate with a positive photosensitive light-shielding composition layer. The obtained substrate with a positive photosensitive light-shielding composition layer was exposed at an exposure amount of 500 mJ/cm² (in terms of a wavelength of 365 nm) from a side opposite to the opaque wiring electrode formation surface using the opaque wiring electrode as a mask. Thereafter, immersion development was performed with a 0.2 mass % sodium carbonate aqueous solution for 60 seconds, and a light shielding layer was formed at a portion corresponding to the opaque wiring electrode. Heating was performed in an IR heater furnace at 140° C. for 30 minutes to obtain a substrate equipped with a wiring electrode. The results evaluated by the above-mentioned method are shown in Table 1.

Examples 2 to 9

An opaque wiring electrode and a light shielding layer were formed in the same manner as in Example 1 except that a transparent substrate, a composition of a positive photosensitive light-shielding composition, and film thickness of a light shielding layer were changed as shown in Table 1, and the same evaluation as in Example 1 was performed. Table 1 shows results.

Example 10

An opaque wiring electrode and a light shielding layer were formed in the same manner as in Example 1 except that the exposure amount in <Formation of opaque wiring electrode> of Example 1 was changed to 2000 mJ/cm$^2$ (in terms of a wavelength of 365 nm). The line width of the opaque wiring electrode was 7 μm. The same evaluation as in Example 1 was performed. The results are shown in Table 1.

Example 11

An opaque wiring electrode was formed in the same manner as in <Formation of opaque wiring electrode> of Example 1. The positive photosensitive light-shielding composition obtained in Example 1 was printed on a side opposite to an opaque wiring electrode formation surface of the obtained substrate equipped with an opaque wiring electrode by screen printing so as to have a film thickness of 2 μm after drying, and dried at 100° C. for 10 minutes, thus obtaining a substrate with a positive photosensitive light-shielding composition layer. The obtained substrate with a positive photosensitive light-shielding composition layer was exposed at an exposure amount of 500 mJ/cm$^2$ (in terms of a wavelength of 365 nm) from the opaque wiring electrode formation surface side using the opaque wiring electrode as a mask. Thereafter, immersion development was performed with a 0.2 mass % sodium carbonate aqueous solution for 60 seconds, and a light shielding layer was formed at a portion corresponding to the opaque wiring electrode. Heating was performed in an IR heater furnace at 140° C. for 30 minutes to obtain a substrate equipped with a wiring electrode. The same evaluation as in Example 1 was performed. The results are shown in Table 1.

Example 12

In the same manner as in <Formation of opaque wiring electrode> of Example 1, opaque wiring electrodes were sequentially formed on both sides of the transparent substrate (a-1). A light shielding layer was formed on one side of the obtained substrate equipped with an opaque wiring electrode in the same manner as in <Formation of light shielding layer> of Example 1, and the same evaluation as in Example 1 was performed. Table 1 shows results.

Example 13

<Formation of Opaque Wiring Electrode>
The transparent substrate (a-1) and low-profile ultra-thin copper foil MTSD-H (thickness: 3 μm, manufactured by Mitsui Mining & Smelting Co., Ltd.) were made to adhere using a liquid optically clear adhesive LOCA (manufactured by Henkel Japan Ltd.) as a transparent adhesive layer (insulating layer). The obtained film with a copper foil was subjected to pattern formation of an opaque wiring electrode to obtain the pattern for visibility and conductivity evaluation shown in FIG. 7 (pitch 300 μm) by using a photolithographic method. As a result of measuring the line width of the opaque wiring electrode with an optical microscope, the line width was 4 μm. The transmittance of the pad portion 6 at a wavelength of 365 nm measured in the same manner as in Example 1 was 0%.
<Formation of Light Shielding Layer>
A light shielding layer was formed on the obtained substrate equipped with an opaque wiring electrode in the same manner as in Example 1, and the same evaluation as in Example 1 was performed. Table 1 shows results.

Example 14

<Formation of First Opaque Wiring Electrode>
A first opaque wiring electrode was formed on one side of the transparent substrate (a-1) in the same manner as in Example 1.
<Formation of Insulating Layer>
The insulating paste (e) obtained in Production Example 5 was printed on an opaque wiring electrode formation surface of the obtained substrate equipped with an opaque wiring electrode by screen printing so as to have a film thickness of 5 m after drying, dried at 100° C. for 10 minutes, and exposed at an exposure amount of 1000 mJ/cm$^2$ (in terms of a wavelength of 365 nm) to form an insulating layer.
<Formation of Second Opaque Wiring Electrode>
A second opaque wiring electrode was formed on an insulating layer formation surface of the obtained substrate equipped with a wiring electrode in the same manner as the formation of the first opaque wiring electrode.
<Formation of Light Shielding Layer>
A light shielding layer was formed on an opaque wiring electrode formation surface of the obtained substrate equipped with an opaque wiring electrode in the same manner as in Example 1, and evaluation was performed in the same manner as in Example 1. Table 1 shows results.

Example 15

<Formation of First Opaque Wiring Electrode and First Light Shielding Layer>
A first opaque wiring electrode and a first light shielding layer were formed on one side of the transparent substrate (a-1) in the same manner as in Example 1.
<Insulating Layer>
An insulating layer was formed on a wiring electrode formation surface of the obtained substrate equipped with a wiring electrode in the same manner as in Example 14.
<Formation of Second Wiring Electrode>
A second opaque wiring electrode and a second light shielding layer were formed on an insulating layer formation surface of the obtained substrate equipped with a wiring electrode in the same manner as the formation of the first opaque wiring electrode and the light shielding layer, and evaluation was performed in the same manner as in Example 1. Table 1 shows results.

Comparative Example 1

A substrate equipped with an opaque wiring electrode was formed in the same manner as in <Formation of opaque wiring electrode> of Example 1, and evaluation other than fine processability and conductivity was performed in the same manner as in Example 1. Table 1 shows results.

Comparative Example 2

A substrate equipped with an opaque wiring electrode was formed in the same manner as in <Formation of opaque wiring electrode> of Example 13, and evaluation other than fine processability and conductivity was performed in the same manner as in Example 1. Table 1 shows results.

Comparative Example 3

A substrate equipped with an opaque wiring electrode was formed in the same manner as in <Formation of opaque wiring electrode> of Example 1.

An aqueous solution of hydrochloric acid was prepared by adding 40 g of 36 mass % hydrochloric acid to 50 g of water. Next, 3 g of tellurium oxide was added to 90 g of the aqueous hydrochloric acid solution. After it was visually confirmed that tellurium oxide was completely dissolved in the aqueous hydrochloric acid solution, 5 g of acetic acid was added to the aqueous hydrochloric acid solution, and water was added to a total amount of 100 g to prepare a blackening solution. The above-mentioned substrate equipped with an opaque wiring electrode was immersed in the obtained blackening solution for 10 seconds to be blackened, thereby forming a substrate equipped with a wiring electrode. Evaluation other than fine processability was performed in the same manner as in Example 1. Table 1 shows results.

Comparative Example 4

A substrate equipped with an opaque wiring electrode was formed in the same manner as in <Formation of opaque wiring electrode> of Example 1. A blackening solution was prepared in the same manner as in Comparative Example 3. The above-mentioned substrate equipped with an opaque wiring electrode was immersed in the obtained blackening solution for 2 seconds to be blackened, thereby forming a substrate equipped with a wiring electrode. Evaluation other than fine processability was performed in the same manner as in Example 1. Table 1 shows results.

TABLE 1

| | | Positive photosensitive light-shielding composition ||||| 
| | | Colorant || Photosensitizer || Alkali- |
| | Transparent substrate | Component | Content * (Part(s) by mass) | Component | Content * (Part(s) by mass) | soluble Resin Component |
|---|---|---|---|---|---|---|
| Example 1 | a-1 | b-1 | 5 | c | 30 | d |
| Example 2 | a-1 | b-1 | 1 | c | 30 | d |
| Example 3 | a-1 | b-1 | 10 | c | 30 | d |
| Example 4 | a-1 | b-1 | 5 | c | 10 | d |
| Example 5 | a-1 | b-2 | 5 | c | 30 | d |
| Example 8 | a-1 | b-1 | 5 | c | 30 | d |
| Example 7 | a-1 | b-1 | 5 | c | 30 | d |
| Example 8 | a-1 | b-1 | 5 | c | 30 | d |
| Example 9 | a-2 | b-1 | 5 | c | 30 | d |
| Example 10 | a-1 | b-1 | 5 | c | 30 | d |
| Example 11 | a-1 | b-1 | 5 | c | 30 | d |
| Example 12 | a-1 | b-1 | 5 | c | 30 | d |
| Example 13 | a-1 | b-1 | 5 | c | 30 | d |
| Example 14 | a-1 | b-1 | 5 | c | 30 | d |
| Example 15 | a-1 | b-1 | 5 | c | 30 | d |
| Comparative Example 1 | a-1 | — | — | — | — | — |
| Comparative Example 2 | a-1 | — | — | — | — | — |
| Comparative Example 3 | a-1 | — | — | — | — | — |
| Comparative Example 4 | a-1 | — | — | — | — | — |

| | | | Evaluation result ||||
| | Electrode line width [μm] | Light shielding layer thickness [μm] | Visibility || Fine processability Light shielding layer line width [μm] | Conductivity |
| | | | Visual evaluation | Reflectance [%] | | |
|---|---|---|---|---|---|---|
| Example 1 | 4 | 2 | A | 7 | 4 | B |
| Example 2 | 4 | 2 | C | 26 | 4 | B |
| Example 3 | 4 | 2 | A | 5 | 4 | B |
| Example 4 | 4 | 0.7 | B | 17 | 4 | B |
| Example 5 | 4 | 2 | A | 9 | 4 | B |
| Example 6 | 4 | 0.2 | C | 26 | 4 | B |
| Example 7 | 4 | 0.7 | B | 17 | 4 | B |

TABLE 1-continued

| | | | | | | |
|---|---|---|---|---|---|---|
| Example 8 | 4 | 6 | A | 5 | 6 | B |
| Example 9 | 4 | 2 | A | 7 | 4 | B |
| Example 10 | 7 | 2 | B | 7 | 7 | B |
| Example 11 | 4 | 2 | A | 7 | 4 | B |
| Example 12 | 4 | 2 | A | 7 | 4 | B |
| Example 13 | 4 | 2 | A | 7 | 4 | B |
| Example 14 | 4 | 2 | A | 7 | 4 | B |
| Example 15 | 4 | 2 | A | 7 | 4 | B |
| Comparative Example 1 | 4 | — | D | 50 | — | — |
| Comparative Example 2 | 6 | — | D | 60 | — | — |
| Comparative Example 3 | 4 | — | B | 20 | — | D |
| Comparative Example 4 | 4 | — | D | 40 | — | C |

* parts by mass based on 100 parts by mass of alkali-soluble resin

Example 21

<Negative Photosensitive Light-Shielding Composition>

17.5 g of the carboxyl group-containing acrylic copolymer (d-1) produced in Production Example 1, 0.5 g of photopolymerization initiator N-1919 (manufactured by ADEKA Corporation), 1.5 g of epoxy resin "Adeka Resin (registered trademark)" EP-4530 (epoxy equivalent 190, manufactured by ADEKA Corporation), 3.5 g of monomer "Light Acrylate (registered trademark)" BP-4EA (manufactured by Kyoeisha Chemical Co., Ltd.), and 19.0 g of DMEA were placed in a 100 mL clean bottle and mixed by using "Awatori Rentaro (registered trademark)" ARE-310 (manufactured by Thinky) to produce 42.0 g of resin solution. The obtained resin solution in an amount of 42 g and 1.2 g of activated carbon powder (b-1) were mixed together, and kneaded using a three-roll mill EXAKT M50 (manufactured by EXAKT), 6.5 g of DMEA was then added, and the mixture was mixed to obtain 50 g of a photosensitive light-shielding paste. The viscosity of the negative photosensitive light-shielding composition was 17,000 mPa·s. The viscosity is a value measured using a Brookfield viscometer at a temperature of 25° C. and a rotational speed of 3 rpm.

<Formation of Light Shielding Layer>

The negative photosensitive light-shielding composition obtained by the above method was printed on one side of the transparent substrate (a-1) by screen printing so as to have a film thickness of 1 μm after drying, and dried at 100° C. for 10 minutes. The resultant dried film was exposed at an exposure amount of 500 mJ/cm$^2$ (in terms of a wavelength of 365 nm) by exposure equipment (PEM-6M; manufactured by UNION OPTICAL CO., LTD.) through an exposure mask having a mesh-shaped pattern with a pitch of 300 μm shown in FIG. 7. The mask opening width was 3 μm. Thereafter, immersion development was performed with a 0.2 mass % sodium carbonate aqueous solution for 30 seconds, rinsed with ultrapure water, and then heated in an IR heater furnace at 140° C. for 30 minutes to obtain a substrate equipped with a wiring electrode. As a result of measuring the line width of the light shielding layer with an optical microscope, the line width was 4 μm. In the pattern for visibility and conductivity evaluation shown in FIG. 7, the transmittance of the light shielding layer of the pad portion 6 at a wavelength of 365 nm was 5%. The transmittance of the light shielding layer was measured by a microscopic area spectroscopic color difference meter (VSS 400: manufactured by Nippon Denshoku Industries Co., Ltd.).

<Positive Photosensitive Conductive Composition>

20.0 g of carboxyl group-containing acrylic copolymer (d-2) obtained in Production Example 4, 6.0 g of quinone diazide compound (c) obtained in Production Example 3, and 40.0 g of PMA were placed in a 100 mL clean bottle and mixed by using "Awatori Rentaro (registered trademark)" ARE-310 (manufactured by Thinky) to produce 66.0 g of resin solution. 66 g of the obtained resin solution and 105 g of Ag powder having an average particle diameter of 0.2 μm were mixed together, and the mixture was kneaded using a three-roll mill (EXAKT M-50 manufactured by EXAKT) to obtain 161 g of positive photosensitive conductive composition.

<Formation of Wiring Electrode>

The positive photosensitive conductive composition obtained by the above method was printed on a light shielding layer formation surface of the obtained substrate with a light shielding layer by screen printing so as to have a film thickness of 1.5 μm after drying, and dried at 100° C. for 10 minutes, thus obtaining a substrate with a positive photosensitive conductive composition layer. The obtained substrate with a positive photosensitive conductive composition layer was exposed at an exposure amount of 500 mJ/cm$^2$ (in terms of a wavelength of 365 nm) from a side opposite to the light shielding layer formation surface of the transparent substrate using the light shielding layer as a mask. Thereafter, immersion development was performed with a 0.2 mass % sodium carbonate aqueous solution for 60 seconds, and a wiring electrode was formed at a portion corresponding to the light shielding layer. Heating was performed in an IR heater furnace at 140° C. for 30 minutes to obtain a substrate equipped with a wiring electrode. The results evaluated by the above-mentioned method are shown in Table 2.

Examples 22 to 30

A light shielding layer and a wiring electrode were formed in the same manner as in Example 21 except that a transparent substrate, a composition of a positive photosensitive conductive composition, a content of a colorant in a light shielding layer, film thickness of the light shielding layer, and line width of the light shielding layer were changed as shown in Table 2, and the same evaluation as in Example 21 was performed. Table 2 shows results.

Example 31

<Formation of Light Shielding Layer>

The positive photosensitive light-shielding composition obtained by the method of Example 1 was printed on one side of the transparent substrate (a-1) by screen printing so as to have a film thickness of 1 μm after drying, and dried at 100° C. for 10 minutes. The resultant dried film was exposed at an exposure amount of 500 mJ/cm$^2$ (in terms of a wavelength of 365 nm) by exposure equipment (PEM-6M; manufactured by UNION OPTICAL CO., LTD.) through an exposure mask having a mesh-shaped pattern with a pitch of 300 μm shown in FIG. 7. The mask opening width was 3 μm. Thereafter, immersion development was performed with a 0.2 mass % sodium carbonate aqueous solution for 30 seconds, rinsed with ultrapure water, and then heated in an IR heater furnace at 140° C. for 30 minutes to obtain a substrate with a light shielding layer. As a result of measuring the line width of the light shielding layer with an optical microscope, the line width was 4 μm. In the pattern for visibility and conductivity evaluation shown in FIG. 7, the transmittance of the light shielding layer of the pad portion 6 at a wavelength of 365 nm was 5%. The transmittance of the light shielding layer was measured in the same manner as in Example 21.

<Formation of Wiring Electrode>

A wiring electrode was formed in the same manner as in <Formation of wiring electrode> of Example 21, and the same evaluation as in Example 21 was performed.

Example 32

A light shielding layer was formed in the same manner as in <Formation of light shielding layer> of Example 21. The positive photosensitive conductive composition obtained in Example 1 was printed on a side opposite to a light shielding layer formation surface of the obtained substrate with a light shielding layer by screen printing so as to have a film thickness of 1.5 μm after drying, and dried at 100° C. for 10 minutes, thus obtaining a substrate with a positive photosensitive conductive composition layer. The obtained substrate with a positive photosensitive conductive composition layer was exposed at an exposure amount of 500 mJ/cm$^2$ (in terms of a wavelength of 365 nm) from the light shielding layer formation surface side using the light shielding layer as a mask. Thereafter, immersion development was performed with a 0.2 mass % sodium carbonate aqueous solution for 60 seconds, and a wiring electrode was formed at a portion corresponding to the light shielding layer. Heating was performed in an IR heater furnace at 140° C. for 30 minutes to obtain a substrate equipped with a wiring electrode. The same evaluation as in Example 1 was performed. The results are shown in Table 1.

Example 33

<Formation of First Light Shielding Layer and First Wiring Electrode>

A first light shielding layer and a first wiring electrode were formed on one side of the transparent substrate (a-1) in the same manner as in <Formation of light shielding layer> and <Formation of wiring electrode> of Example 21.

<Formation of Insulating Layer>

The insulating paste (e) obtained in Production Example 5 was printed on a wiring electrode formation surface of the obtained substrate equipped with a wiring electrode by screen printing so as to have a film thickness of 5 μm after drying, dried at 100° C. for 10 minutes, and exposed at an exposure amount of 1000 mJ/cm$^2$ (in terms of a wavelength of 365 nm) to form an insulating layer.

<Formation of Second Light Shielding Layer and Second Wiring Electrode>

A second light shielding layer and a second wiring electrode were formed on an insulating layer formation surface of the obtained substrate equipped with a wiring electrode in the same manner as the formation of the first light shielding layer and the first wiring electrode, and evaluation was performed in the same manner as in Example 1. Table 2 shows results.

Comparative Example 11

The positive photosensitive conductive composition obtained in Example 21 was printed on one side of the transparent substrate (a-1) by screen printing so as to have a film thickness of 1.5 μm after drying, and dried at 100° C. for 10 minutes, thus obtaining a substrate with a positive photosensitive conductive composition layer. The obtained substrate with a positive photosensitive conductive composition layer was exposed at an exposure amount of 500 mJ/cm$^2$ (in terms of a wavelength of 365 nm) from the light shielding layer formation surface side of the transparent substrate using the exposure mask having the pattern shown in FIG. 6. Thereafter, immersion development was performed with a 0.2 mass % sodium carbonate aqueous solution for 60 seconds, and then heated in an IR heater furnace at 140° C. for 30 minutes to obtain a substrate equipped with a wiring electrode. The results evaluated by the above-mentioned method are shown in Table 2.

Comparative Example 12

A substrate equipped with a wiring electrode was obtained by the same method as in Comparative Example 1. The substrate was blackened in the same manner as in Comparative Example 3 to form a substrate equipped with a wiring electrode. The same evaluation as in Example 1 was performed. Table 2 shows results.

TABLE 2

| | | Positive photosensitive conductive composition | | | | |
|---|---|---|---|---|---|---|
| | | Conductive particles | | Photosensitizer | | Alkali-soluble |
| | Transparent substrate | Component | Content * (mass %) | Component | Content * (Part(s) by mass) | Resin Component |
| Example 21 | a-1 | Ag | 80 | c | 30 | d |
| Example 22 | a-1 | Ag | 65 | c | 30 | d |
| Example 23 | a-1 | Ag | 90 | c | 30 | d |

TABLE 2-continued

| | | | | | | | |
|---|---|---|---|---|---|---|---|
| Example 24 | a-1 | Ag | 80 | c | 10 | d | |
| Example 25 | a-1 | Ag | 80 | c | 40 | d | |
| Example 26 | a-1 | Ag | 80 | c | 30 | d | |
| Example 27 | a-1 | Ag | 80 | c | 30 | d | |
| Example 28 | a-1 | Ag | 80 | c | 30 | d | |
| Example 29 | a-1 | Ag | 80 | c | 30 | d | |
| Example 30 | a-2 | Ag | 80 | c | 30 | d | |
| Example 31 | a-1 | Ag | 80 | c | 30 | d | |
| Example 32 | a-1 | Ag | 80 | c | 30 | d | |
| Example 33 | a-1 | Ag | 80 | c | 30 | d | |
| Comparative Example 11 | a-1 | Ag | 80 | c | 30 | d | |
| Comparative Example 12 | a-1 | Ag | 80 | c | 30 | d | |

| | Light shielding layer | | | Evaluation result | | Fine processability | |
|---|---|---|---|---|---|---|---|
| | Colorant | Film | Line width | Visibility | | Wiring electrode | |
| | Content (mass %) | thickness [μm] | [μm] | Visual evaluation | Reflectance [%] | line width [μm] | Conductivity |
| Example 21 | 5 | 1 | 4 | A | 9 | 4 | B |
| Example 22 | 5 | 1 | 4 | A | 9 | 4 | C |
| Example 23 | 5 | 1 | 4 | A | 9 | 4 | B |
| Example 24 | 5 | 1 | 4 | A | 9 | 4 | B |
| Example 25 | 5 | 1 | 4 | B | 9 | 6 | B |
| Example 26 | 1 | 1 | 4 | C | 27 | 4 | B |
| Example 27 | 5 | 0.1 | 4 | C | 27 | 4 | B |
| Example 28 | 5 | 0.5 | 4 | B | 18 | 4 | B |
| Example 29 | 5 | 1 | 6 | B | 9 | 6 | B |
| Example 30 | 5 | 1 | 4 | A | 9 | 4 | B |
| Example 31 | 5 | 1 | 4 | A | 9 | 4 | B |
| Example 32 | 5 | 1 | 4 | A | 9 | 4 | B |
| Example 33 | 5 | 1 | 4 | A | 9 | 4 | B |
| Comparative Example 11 | — | — | — | D | 50 | 4 | B |
| Comparative Example 12 | — | — | — | D | 50 | 4 | D |

* parts by mass based on 100 parts by mass of alkali-soluble resin

INDUSTRIAL APPLICABILITY

By using the method for manufacturing a substrate equipped with a wiring electrode of the present invention, it is possible to obtain a substrate equipped with a wiring electrode which has a fine pattern and is excellent in conductivity and in which an opaque wiring electrode is hardly visible and provide a touch panel having a good appearance.

DESCRIPTION OF REFERENCE SIGNS

1: Transparent substrate
2: Opaque wiring electrode
3: Functional layer
4: Insulating layer
5: Positive photosensitive composition
6: Pad portion
7: Light shielding layer
8: Wiring electrode
9: Positive photosensitive conductive composition

The invention claimed is:

1. A method for manufacturing a substrate equipped with a wiring electrode, the method comprising the steps of:
    forming a patterned opaque wiring electrode on a portion of at least one of first and second opposing sides of a transparent substrate;
    applying a positive photosensitive composition on the first side of the transparent substrate; and
    exposing the positive photosensitive composition through the transparent substrate using the patterned opaque wiring electrode as a mask and developing so as to form a functional light shielding layer from remaining positive photosensitive composition disposed on the opaque wiring electrode disposed on the first side and/or a masking portion corresponding to on the opaque wiring electrode disposed on the second side.

2. The method according to claim 1, wherein the positive photosensitive composition and the opaque wiring electrode are formed on the first side of the transparent substrate and the positive photosensitive composition is exposed from the second side of the transparent substrate.

3. The method according to claim 2, wherein the step of forming the opaque wiring electrode on the first side of the transparent substrate includes:
    a step of forming a first opaque wiring electrode on a first portion of the first side of the transparent substrate,
    a step of forming an insulating layer on the first side and on the first opaque wiring electrode, and
    a step of forming a second opaque wiring electrode on a second portion of the insulating layer,
    wherein the functional light shielding layer is formed from the remaining positive photosensitive composition disposed at a location corresponding to the first portion of the first opaque wiring electrode and disposed on the second opaque wiring electrode.

4. The method according to claim 2, further comprising the steps of:
applying a first positive photosensitive composition to the first side and on a first opaque wiring electrode formed on the first side of the transparent substrate;
exposing and developing the first positive photosensitive composition from the second side of the transparent substrate so as to form a first functional light shielding layer from the remaining positive photosensitive composition disposed on the first opaque wiring electrode;
forming an insulating layer on the first side and the first functional light shielding layer;
forming a second opaque wiring electrode on the insulating layer;
applying a second positive photosensitive composition to the insulating layer and on the second opaque wiring electrode; and
exposing and developing the second positive photosensitive composition from the second side of the transparent substrate so as to form a second functional light shielding layer from the remaining second positive photosensitive composition disposed on the second opaque wiring electrode.

5. The method according to claim 1, wherein the positive photosensitive composition is applied to the first side of the transparent substrate, the opaque wiring electrode is formed on the second side of the transparent substrate, and the positive photosensitive composition is exposed from the second side of the transparent substrate.

6. The method according to claim 1, wherein the opaque wiring electrodes are formed on both sides of the transparent substrate and the positive photosensitive composition is exposed from the second side of the transparent substrate.

7. The method according to claim 1, wherein transmittance of the opaque wiring electrode at 365 nm is 20% or less.

8. The method according to claim 1, wherein the opaque wiring electrode contains a photopolymerization initiator and/or photolysis products of the photopolymerization initiator.

9. The method according to claim 1, wherein reflectance of the functional layer and/or the light shielding layer at 550 nm is 25% or less.

10. The method according to claim 1, wherein line width of the wiring electrode is 1 to 10 μm.

11. The method according to claim 1, wherein the substrate equipped with a wiring electrode is a member for a touch panel.

12. A method for manufacturing a substrate equipped with a wiring electrode, the method comprising the steps of:
forming a pattern of a light shielding layer on portions of one side of first or second opposing sides of a transparent substrate;
applying a positive photosensitive conductive composition to the first side of the transparent substrate and on any portions of existing light shielding layer; and
exposing and developing the positive photosensitive conductive composition through the transparent substrate using the light shielding layer as a mask to form a wiring electrode at any portions corresponding to the light shielding layer on the first or second sides of the transparent substrate.

13. The method according to claim 12, wherein the positive photosensitive conductive composition and the light shielding layer are applied on the first side of the transparent substrate, and the positive photosensitive conductive composition is exposed from the second side of the transparent substrate.

14. The method according to claim 13, further comprising the steps of:
applying a first positive photosensitive conductive composition to the first side and on a first light shielding layer formed on the first side of the transparent substrate;
exposing and developing the first positive photosensitive conductive composition from the second side of the transparent substrate using the light shielding layer as a mask to form a first wiring electrode from the remaining positive photosensitive composition disposed on the light shielding layer;
forming an insulating layer on the first side and the first wiring electrode;
forming a second light shielding layer on the insulating layer;
applying a second positive photosensitive conductive composition to the insulating layer and on the second light shielding layer; and
exposing and developing the positive photosensitive conductive composition from the second side of the transparent substrate to form the wiring electrode at a portion corresponding to the second light shielding layer.

15. The method according to claim 12, wherein the positive photosensitive conductive composition is applied to the first side of the transparent substrate, the light shielding layer is formed on the second side of the transparent substrate, and the positive photosensitive conductive composition is exposed from the second side of the transparent substrate.

16. The method according to claim 12, wherein the light shielding layer includes a photocured product of a negative or positive photosensitive light-shielding composition containing a colorant.

17. The method according to claim 16, wherein the light shielding layer contains a photopolymerization initiator and/or photolysis products of the photopolymerization initiator.

18. A method for manufacturing a substrate equipped with a wiring electrode, the method comprising the steps of:
forming a first opaque wiring electrode on a first portion of a first side of first and second opposing sides of a transparent substrate;
forming an insulating layer on the first side and on the first opaque wiring electrode;
forming a second opaque wiring electrode on a second portion of the insulating layer;
applying a positive photosensitive composition on the insulating layer and on the second opaque wiring electrode formed on the first side; and
exposing and developing the positive photosensitive composition from the second side of the transparent substrate using the first and second opaque wiring electrodes as masks so as to form a functional light shielding layer from remaining positive photosensitive composition disposed on the second opaque wiring electrode at the second portion and on a portion corresponding to the first portion of the first opaque wiring electrode.

* * * * *